(12) United States Patent
Okada et al.

(10) Patent No.: US 12,068,115 B2
(45) Date of Patent: Aug. 20, 2024

(54) CERAMIC ELECTRONIC COMPONENT, CIRCUIT SUBSTRATE ARRANGEMENT, AND METHOD OF MANUFACTURING CERAMIC ELECTRONIC COMPONENT

(71) Applicant: TAIYO YUDEN CO., LTD., Tokyo (JP)

(72) Inventors: Anju Okada, Tokyo (JP); Mina Amano, Tokyo (JP); Takahisa Fukuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 116 days.

(21) Appl. No.: 17/704,797

(22) Filed: Mar. 25, 2022

(65) Prior Publication Data

US 2022/0328251 A1 Oct. 13, 2022

(30) Foreign Application Priority Data

Mar. 31, 2021 (JP) .................. 2021-059573

(51) Int. Cl.
*H01G 4/30* (2006.01)
*H01G 4/224* (2006.01)
(Continued)

(52) U.S. Cl.
CPC .............. *H01G 4/30* (2013.01); *H01G 4/224* (2013.01); *H01G 4/248* (2013.01); *H05K 1/181* (2013.01);
(Continued)

(58) Field of Classification Search
CPC .......... H01G 4/30; H01G 4/224; H01G 4/248; H01G 4/012; H01G 4/232; H01G 4/018;
(Continued)

(56) References Cited

U.S. PATENT DOCUMENTS

| 2005/0264975 A1* | 12/2005 | Yamazaki | ................ H01C 7/18 |
| | | | 361/301.1 |
| 2009/0040688 A1* | 2/2009 | Kayatani | .............. H01G 13/006 |
| | | | 361/321.1 |

(Continued)

FOREIGN PATENT DOCUMENTS

| JP | 2012-015543 A | 1/2012 |
| JP | 2015-065284 A | 4/2015 |
| JP | 2007123835 A | 5/2017 |

*Primary Examiner* — Timothy J Thompson
*Assistant Examiner* — Harmandeep Singh
(74) *Attorney, Agent, or Firm* — Stein IP, LLC

(57) ABSTRACT

A ceramic electronic component includes an element body, a first external electrode, and a second external electrode. The element body includes a dielectric, at least one first internal electrode, and at least one second internal electrode laminated over the first internal electrode via the dielectric interposed therebetween. The element body has a top surface, a bottom surface, a pair of side surfaces, a first end surface, and a second end surface, thereby the element body having a generally cuboid shape. The first internal electrode is exposed on the first end surface. The second internal electrode is exposed on the second end surface. The side surfaces of the element body are concavely curved along a longitudinal direction, so that the element body has a longitudinal central part at which a width is less than a width at the end surface. The first external electrode is formed on the first end surface and electrically connected with the first internal electrode. The second external electrode is formed on the second end surface and electrically connected with the second internal electrode.

16 Claims, 16 Drawing Sheets

(51) Int. Cl.
   *H01G 4/248*    (2006.01)
   *H05K 1/18*     (2006.01)
   *H05K 3/30*     (2006.01)

(52) U.S. Cl.
   CPC ... *H05K 3/303* (2013.01); *H05K 2201/10015* (2013.01)

(58) Field of Classification Search
   CPC .................. H05K 1/181; H05K 3/303; H05K 2201/10015; H05K 3/3442
   See application file for complete search history.

(56) References Cited

U.S. PATENT DOCUMENTS

| | | | |
|---|---|---|---|
| 2015/0027764 A1* | 1/2015 | Lee | H01G 4/30 29/25.42 |
| 2015/0084481 A1 | 3/2015 | Mori et al. | 310/311 |
| 2015/0116896 A1* | 4/2015 | Inazuka | H01G 4/30 361/301.4 |
| 2015/0136462 A1* | 5/2015 | Lee | H01G 4/30 361/301.4 |
| 2016/0155569 A1* | 6/2016 | Tsukida | H01G 4/012 156/196 |
| 2018/0047484 A1 | 2/2018 | Mori et al. | |
| 2018/0204679 A1* | 7/2018 | Kwak | H01C 7/1006 |

* cited by examiner

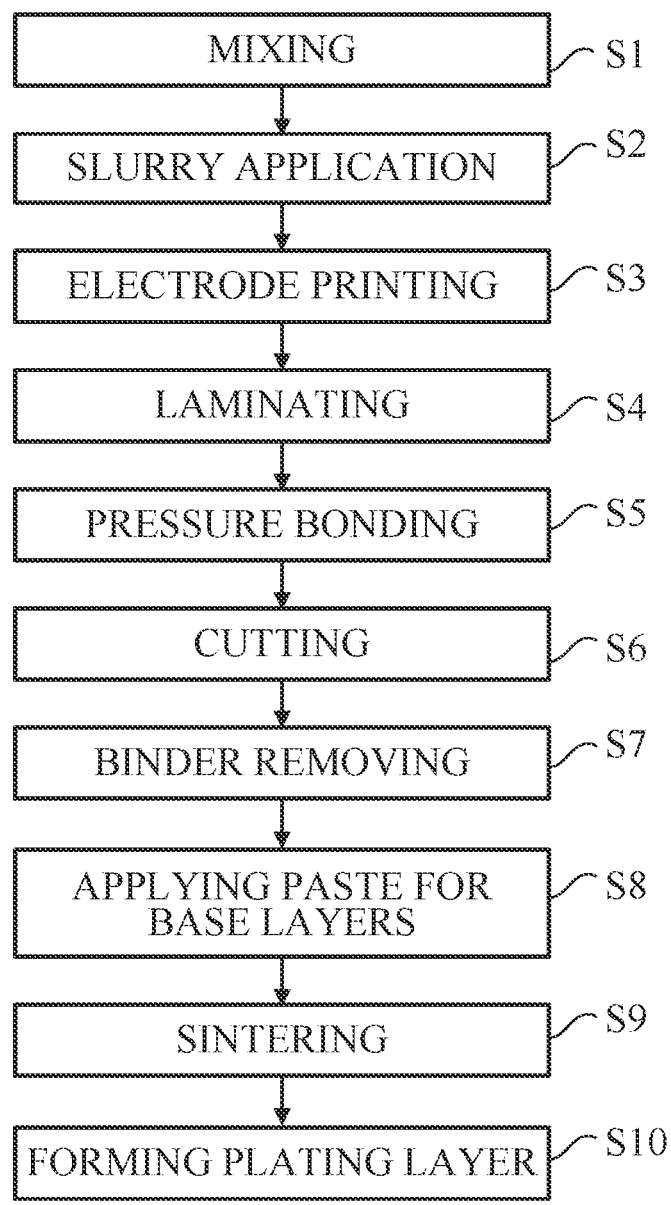

Fig. 11

| | $(W3-W1)/W3$ (%) | $[(W2-W1)/W2]/[(T1-T2)/T2]$ (%) | OCCURRENCE OF CRACKS | RESULTS OF HALT (min) | W1 (mm) | W2 (mm) | W3 (mm) | T1 (mm) | T2 (mm) | T3 (mm) | GOOD OR BAD |
|---|---|---|---|---|---|---|---|---|---|---|---|
| SPECIMEN A | 0.01 | 3.5 | NO | 997 | 2.3914 | 2.3919 | 2.3916 | 2.4893 | 2.4762 | 2.4742 | GOOD |
| SPECIMEN B | 0.03 | 4.9 | NO | 1012 | 2.3932 | 2.3941 | 2.3939 | 2.4938 | 2.475 | 2.4831 | GOOD |
| SPECIMEN C | 0.05 | 6.1 | NO | 1041 | 2.398 | 2.399 | 2.399 | 2.610 | 2.588 | 2.609 | GOOD |
| SPECIMEN D | 0.06 | 6.6 | NO | 1055 | 2.3932 | 2.394 | 2.3945 | 2.4876 | 2.475 | 2.4867 | GOOD |
| SPECIMEN E | 0.08 | 8.2 | NO | 1073 | 2.3914 | 2.3923 | 2.3933 | 2.4881 | 2.4769 | 2.4849 | GOOD |
| SPECIMEN F | 0.09 | 14.2 | NO | 1060 | 2.3874 | 2.3899 | 2.3897 | 2.6771 | 2.6575 | 2.6691 | GOOD |
| SPECIMEN G | 0.10 | 20.3 | NO | 1055 | 2.3959 | 2.3994 | 2.3982 | 2.6682 | 2.6489 | 2.6593 | GOOD |
| SPECIMEN H | 0.12 | 27.7 | NO | 1016 | 2.3905 | 2.3941 | 2.3934 | 2.6656 | 2.6513 | 2.6522 | GOOD |
| SPECIMEN I | 0.15 | 37.9 | NO | 957 | 2.3656 | 2.3692 | 2.3691 | 2.662 | 2.6515 | 2.6442 | GOOD |
| SPECIMEN J | -0.04 | 68.4 | YES | 688 | 2.4039 | 2.4042 | 2.403 | 2.7394 | 2.739 | 2.7376 | BAD |
| SPECIMEN K | 0.22 | 2.8 | YES | 670 | 2.3763 | 2.3781 | 2.3816 | 2.63 | 2.5605 | 2.5614 | BAD |

Fig. 12

| | $\frac{(W3-W1)}{W3}$ (%) | $\frac{[(W2-W1)/W2]}{[(T1-T2)/T2]}$ (%) | OCCURRENCE OF CRACKS | RESULTS OF HALT (min) | W1 (mm) | W2 (mm) | W3 (mm) | T1 (mm) | T2 (mm) | T3 (mm) | GOOD OR BAD |
|---|---|---|---|---|---|---|---|---|---|---|---|
| SPECIMEN L | 0.02 | 4.1 | NO | 987 | 0.821 | 0.8219 | 0.8212 | 0.807 | 0.787 | 0.8029 | GOOD |
| SPECIMEN M | 0.04 | 5.4 | NO | 1002 | 0.8216 | 0.8219 | 0.8219 | 0.8085 | 0.8029 | 0.806 | GOOD |
| SPECIMEN N | 0.05 | 5.4 | NO | 1008 | 0.8231 | 0.8236 | 0.8236 | 0.8469 | 0.8387 | 0.8462 | GOOD |
| SPECIMEN O | 0.06 | 5.8 | NO | 1052 | 0.8216 | 0.822 | 0.8221 | 0.8064 | 0.8001 | 0.8059 | GOOD |
| SPECIMEN P | 0.07 | 6.9 | NO | 1055 | 0.821 | 0.8213 | 0.8216 | 0.8066 | 0.8023 | 0.8055 | GOOD |
| SPECIMEN Q | 0.09 | 8.9 | NO | 1055 | 0.8196 | 0.8223 | 0.8204 | 0.8689 | 0.8381 | 0.8666 | GOOD |
| SPECIMEN R | 0.12 | 20.8 | NO | 1015 | 0.8225 | 0.8228 | 0.8235 | 0.866 | 0.8648 | 0.8628 | GOOD |
| SPECIMEN S | 0.14 | 22.8 | NO | 1019 | 0.8207 | 0.8211 | 0.8218 | 0.8651 | 0.8633 | 0.864 | GOOD |
| SPECIMEN T | 0.17 | 29.3 | NO | 995 | 0.8121 | 0.8133 | 0.8135 | 0.8639 | 0.8599 | 0.8599 | GOOD |
| SPECIMEN U | -0.01 | 2.9 | YES | 679 | 0.8253 | 0.8256 | 0.8252 | 0.8895 | 0.8783 | 0.889 | BAD |
| SPECIMEN V | 0.2 | 2.8 | YES | 665 | 0.8158 | 0.8164 | 0.8174 | 0.8534 | 0.8312 | 0.8293 | BAD |

CERAMIC ELECTRONIC COMPONENT, CIRCUIT SUBSTRATE ARRANGEMENT, AND METHOD OF MANUFACTURING CERAMIC ELECTRONIC COMPONENT

TECHNICAL FIELD

The present invention relates to ceramic electronic components, circuit substrate arrangements, and methods of manufacturing ceramic electronic components.

RELATED ART

As electronic devices become smaller and more sophisticated, there is a need for smaller multilayer ceramic capacitors with higher capacitance. In order to make smaller multilayer ceramic capacitors with higher capacitance, it is contemplated that ceramic dielectric layers are thinned and number of the ceramic dielectric layers and internal electrode layers are increased. However, in this method, delamination may occur, resulting in degradation of characteristics and reliability of multilayer ceramic capacitors.

Patent Document 1 discloses a multilayer ceramic capacitor in which a capacitor body has side surfaces that are concavely curved along the height direction and has a residual compressive stress of 250 MPa or more.

Patent Document 2 discloses a chip-type electronic component in which at least one surface in a stacking direction of a ceramic body is a first curved surface that is convexly curved, in which the expansion coefficient in the stacking direction of the ceramic body is greater than 5% in absolute value, and in which the radius of curvature of the first curved surface is 5.2 mm or less.

Patent Document 1: JP-A-2007-123835
Patent Document 2: JP-A-2012-015543
Patent Document 3: JP-A-2015-65284

SUMMARY OF THE INVENTION

However, in the configurations disclosed in Patent Documents 1 and 2, the residual stress around the stacked internal electrodes that store electric charge is large. As a result, when an external shock or electrical load is applied to the multilayer ceramic capacitor, cracks may occur in the multilayer ceramic capacitor, causing a degradation in insulation resistance and reliability.

Accordingly, it is an object of the present invention to provide a ceramic electronic component that can reduce the thickness of dielectric layers while restricting the degradation of reliability, a circuit substrate arrangement having the ceramic electronic component, and a method of manufacturing the ceramic electronic component.

According to one aspect of the present invention, there is provided a ceramic electronic component including an element body including a dielectric, at least one first internal electrode, and at least one second internal electrode laminated over the first internal electrode via the dielectric interposed therebetween, the element body having a top surface, a bottom surface, a pair of side surfaces, a first end surface, and a second end surface, thereby the element body having a generally cuboid shape, the side surfaces of the element body being concavely curved along a longitudinal direction, so that the element body has a longitudinal central part at which a width is less than a width at the end surfaces; a first external electrode formed on the first end surface and electrically connected with the first internal electrode; and a second external electrode formed on the second end surface and electrically connected with the second internal electrode.

The side surfaces of the element body may be concavely curved along a height direction, and each of the side surfaces may have a radius of curvature along the height direction that may be minimum in the longitudinal central part and that may increase toward the end surfaces.

The element body may satisfy $0<(W3-W1)/W3\leq0.15$, where W1 is a width at the longitudinal central part at a center in a height direction of the element body and W3 is a width at the end surfaces at a center in the height direction of the element body.

The element body may satisfy $0.04<(W3-W1)/W3\leq0.12$.

The top surface and the bottom surface of the element body may be convexly curved along the longitudinal direction, so that the longitudinal central part of the element body may have a thickness that is greater than a thickness at the end surfaces.

The top surface and the bottom surface of the element body may be convexly curved along a width direction, so that a lateral central part of the element body may have a thickness that is greater than a thickness at lateral sides.

The element body may satisfy $3.5\leq[(W2-W1)/W2]/[(T1-T2)/T2]\leq30$, where W1 is a width at the longitudinal central part at a center in a height direction of the element body, W2 is a width at upper edges and/or lower edges at the longitudinal central part of the element body, T1 is a thickness at the longitudinal central part at a center in the width direction of the element body, and T2 is a thickness at the longitudinal central part at lateral sides of the element body.

The element body may satisfy $5.5\leq[(W2-W1)/W2]/[(T1-T2)/T2]\leq20$.

The ceramic electronic component may further include a sealing resin layer covering the top surface of the element body, a top surface of each of the first and second external electrodes, upper portions of the side surfaces of the element body, and upper portions of side surfaces of each of the first and second external electrodes.

The ceramic electronic component may have a length in a range from 0.25 mm to 0.4 mm, a width in a range from 0.125 mm to 0.2 mm, and a height in a range from 0.125 mm to 0.2 mm.

The dielectric between the first internal electrode and the second internal electrode may have a thickness in a range from 0.2 micrometers to 0.5 micrometers.

The dielectric of the element body may have an average crystal grain diameter in a range from 80 nanometers to 200 nanometers.

The first internal electrode and the second internal electrode may have a thickness in a range from 0.2 micrometers to 0.8 micrometers.

The ceramic electronic component may have a capacitance in a range from 10 µF to 1000 µF.

A main component of a material for the first and second external electrodes may be Ni.

According to another aspect of the present invention, there is provided a circuit substrate arrangement including: a circuit substrate; and the ceramic electronic component mounted on the circuit substrate, the ceramic electronic component being connected to the circuit substrate via solder layers adhered to the first and second external electrodes, each of the solder layers wetting up on an end surface of the first external electrode or the second external electrode.

According to another aspect of the present invention, there is provided a method of manufacturing a ceramic electronic component, the method including forming an element body that includes a dielectric, internal electrodes, and cover layers, the element body having a top surface, a bottom surface, a pair of side surfaces, and a pair of end surfaces, thereby the element body having a generally cuboid shape, each of the internal electrodes being exposed on one of the end surfaces, the cover layers forming the top surface and the bottom surface, the cover layers being made of a material having a shrinkage temperature that is higher than a shrinkage temperature of a material of the internal electrodes; sintering the element body; forming base layers of external electrodes located on longitudinal ends of the element body, the base layer of each of external electrodes covering the top surface, the bottom surface, the side surfaces, and the corresponding end surface of the element body; and forming plating layers on the base layers, respectively.

The shrinkage temperature Ta (degree Celsius) of the material of the internal electrodes and the shrinkage temperature Tx (degree Celsius) of the material of the cover layers may satisfy $1.20 \leq Tx/Ta \leq 1.85$.

The shrinkage temperature Ta (degree Celsius) of the material of the internal electrodes and the shrinkage temperature Tx (degree Celsius) of the material of the cover layers may satisfy $1.30 \leq Tx/Ta \leq 1.60$.

The shrinkage temperature Ta (degree Celsius) of the material of the internal electrodes and the shrinkage temperature Tx (degree Celsius) of the material of the cover layers may satisfy $1.30 \leq Tx/Ta \leq 1.40$.

According to aspects of the invention, it is possible to reduce the thickness of dielectric layers while restricting the degradation of reliability.

BRIEF DESCRIPTION OF THE DRAWINGS

FIG. 5 is a flowchart showing a method of manufacturing a multilayer ceramic capacitor according to the first embodiment;

FIG. 11 is a table showing relationship among dimensions, occurrence of cracks, and durability of different specimens of the multilayer ceramic capacitor according to the first embodiment; and FIG. 12 is a table showing relationship among dimensions, occurrence of cracks, and durability of different specimens of the multilayer ceramic capacitor according to the first embodiment.

DESCRIPTION OF EMBODIMENTS

Figure 1:
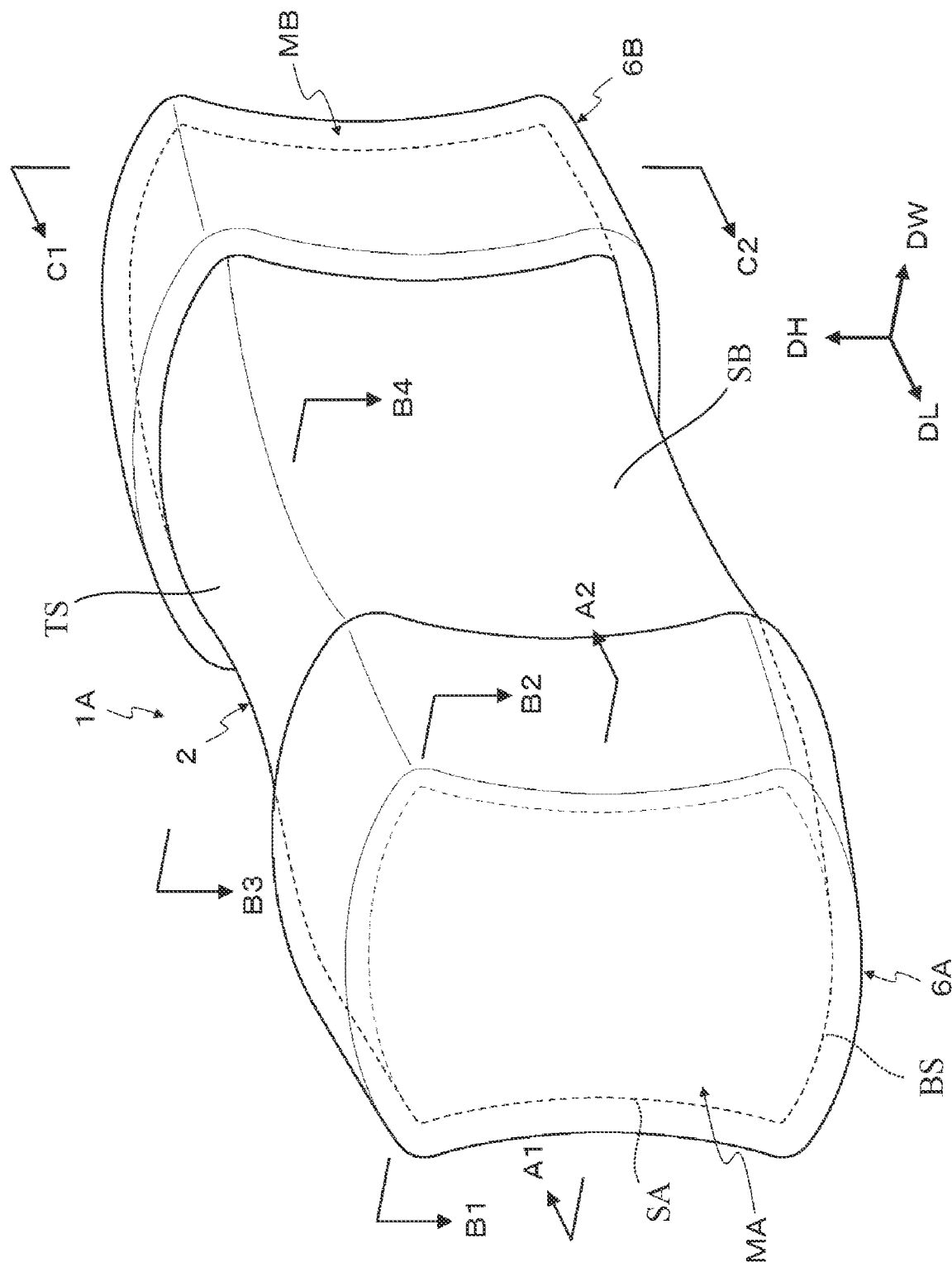
FIG. 1 is a perspective view showing a multilayer ceramic capacitor according to a first embodiment of the present invention.

Embodiments of the present invention will now be described with reference to the accompanying drawings. The following embodiments are not intended to limit the present invention. The combination of all the features described in each of the embodiments is not absolutely necessary for the present invention. The configuration of each embodiment may be modified and/or changed depending upon designs, specifications, and various conditions of an apparatus and a device to which the present invention is applied (use conditions, use environment, and the like). The technical scope of the invention is defined by the appended claims and is not limited by the following embodiments. Furthermore, parts, components, and elements shown in the drawings used in connection with the following description may be different from actual parts, components, and elements in the structure, scale, and shape for the sake of easier understanding of the parts, components, and elements.

First Embodiment

Figure 2A:
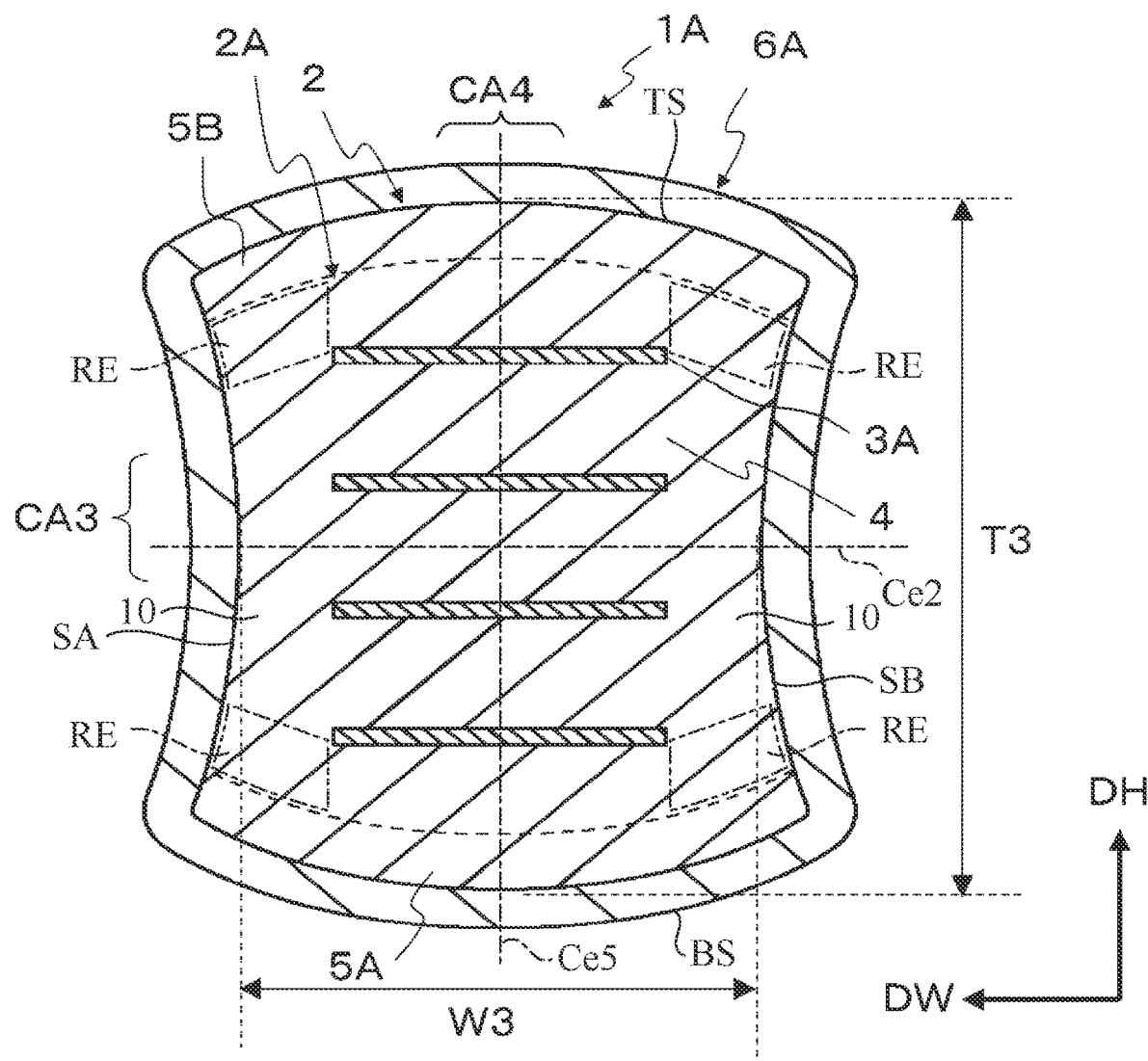
FIG. 2A is a cross-sectional view of the multilayer ceramic capacitor taken along line B1-B2 in FIG. 1.
Figure 2B:
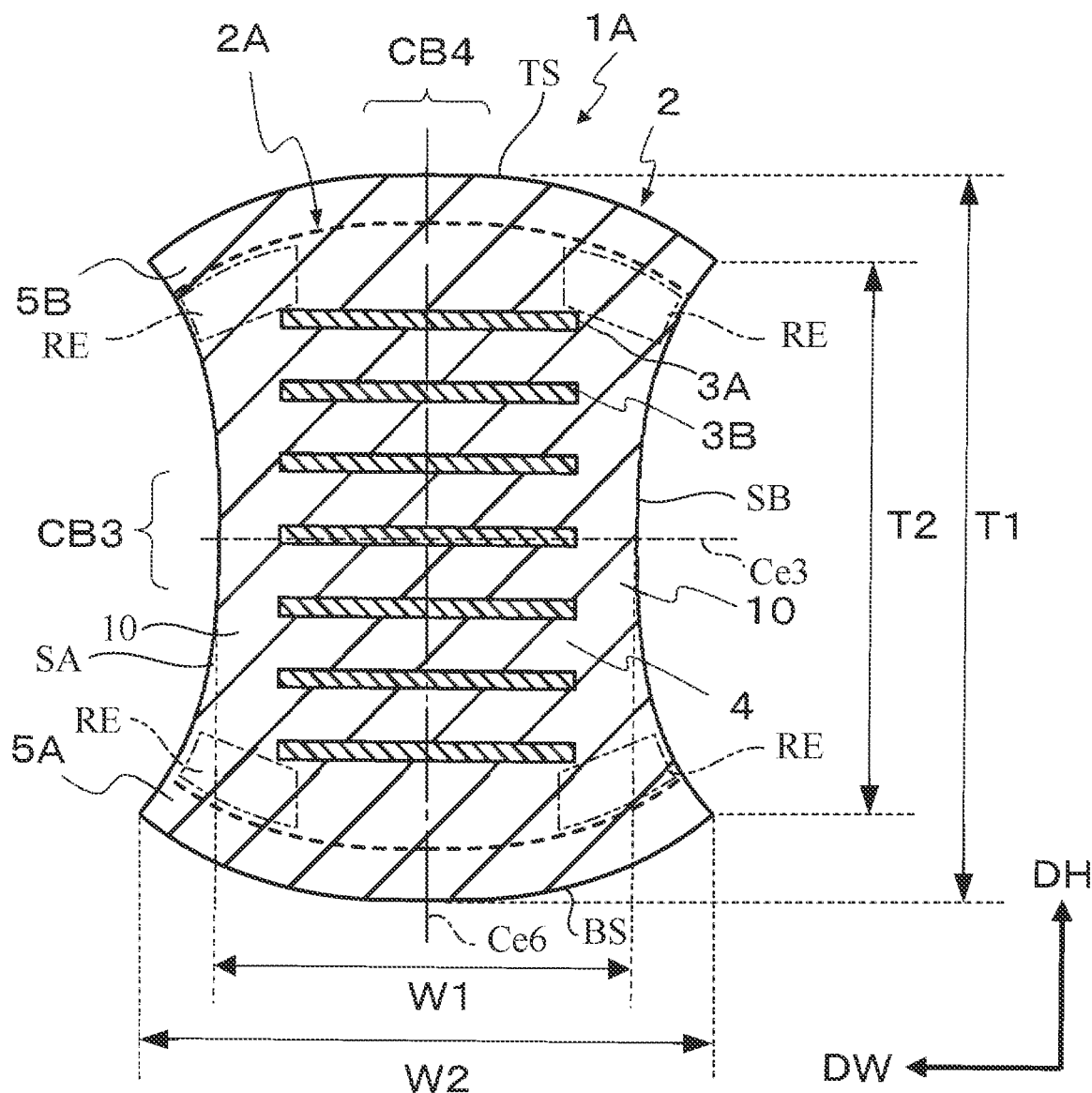
FIG. 2B is a cross-sectional view of the multilayer ceramic capacitor taken along line B3-B4 in FIG. 1.
Figure 3:
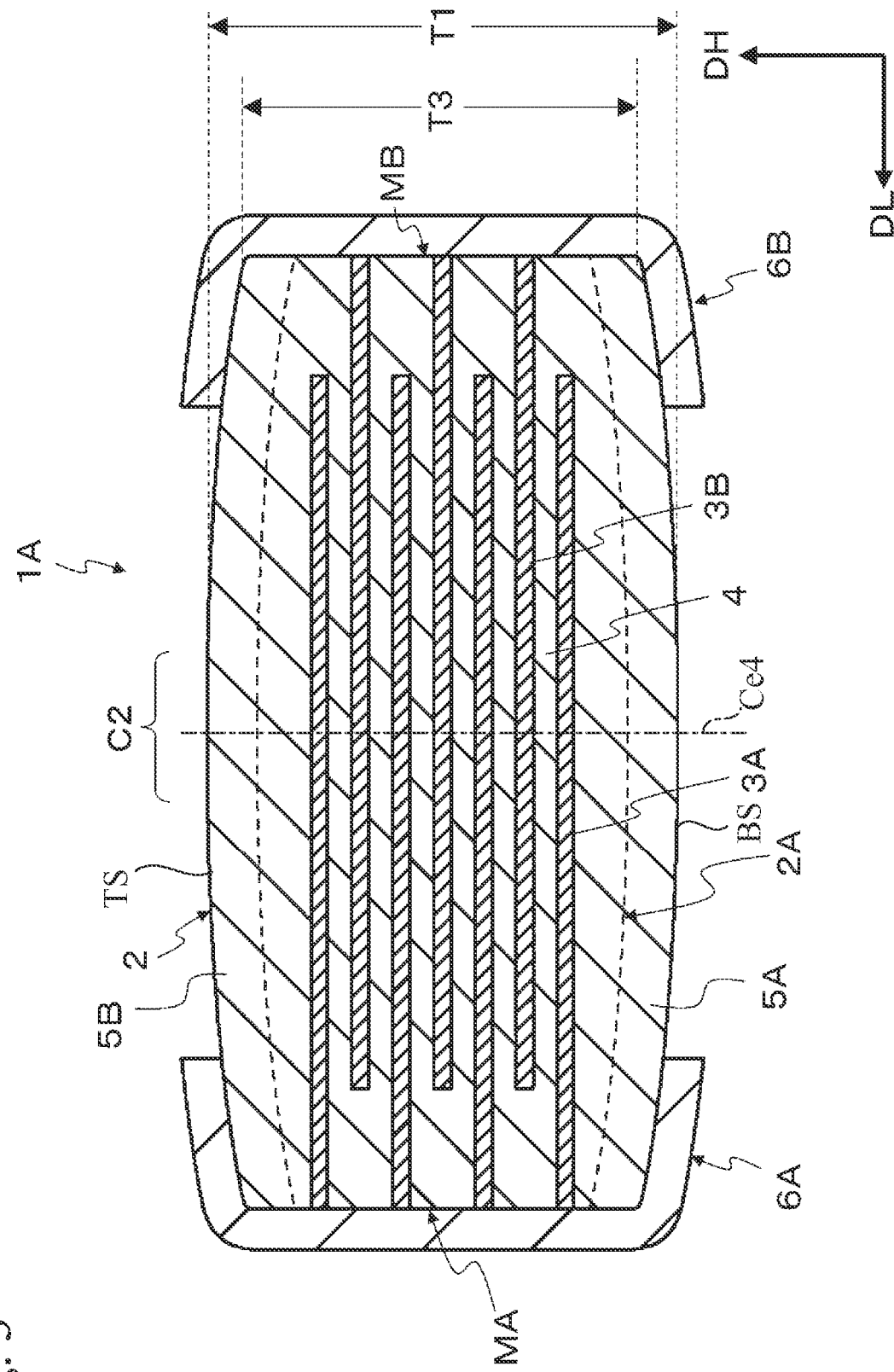
FIG. 3 is a cross-sectional view of the multilayer ceramic capacitor taken along line C1-C2 in FIG. 1.
Figure 4:
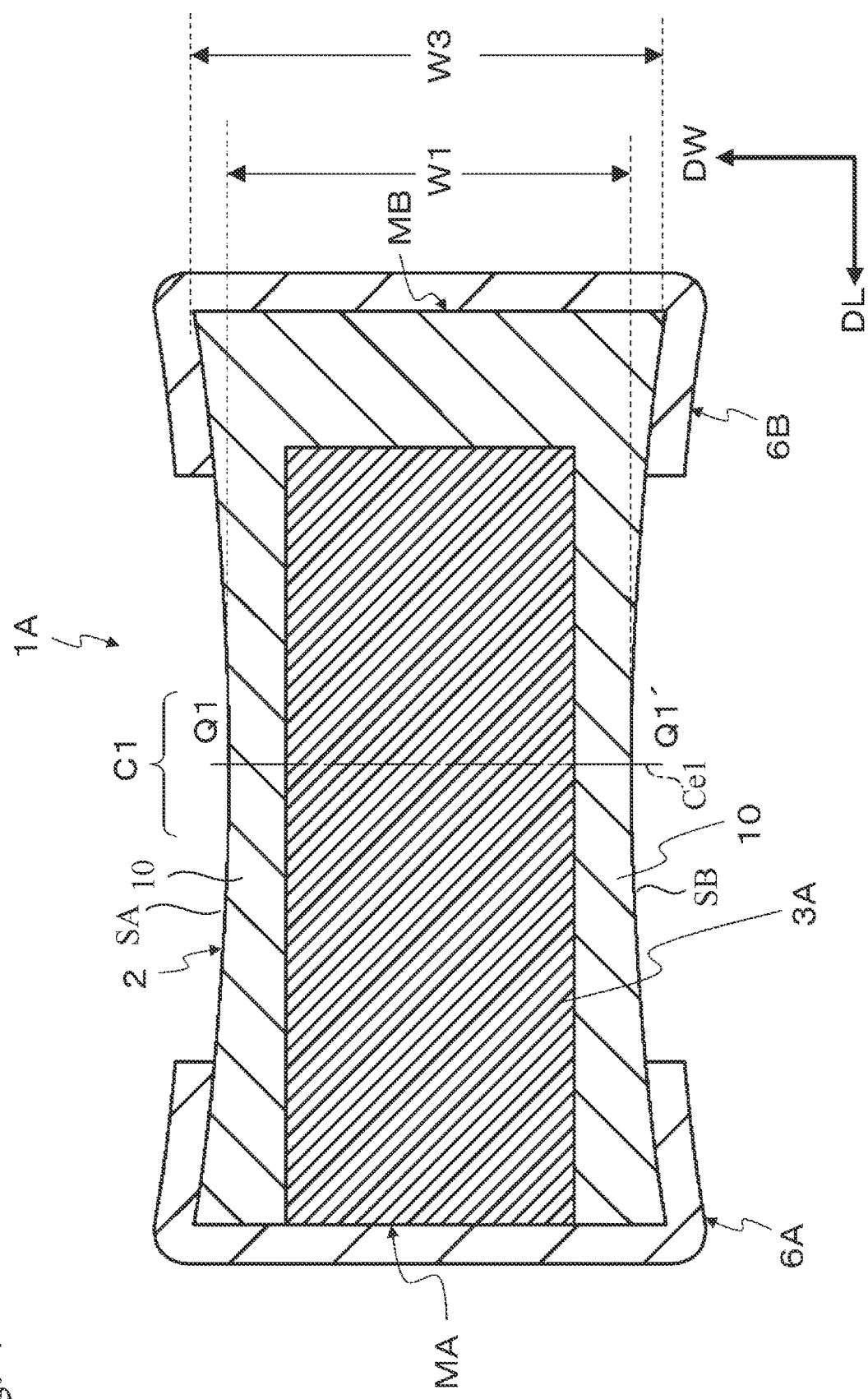
FIG. 4 is a cross-sectional view of the multilayer ceramic capacitor taken along line A1-A2 in FIG. 1.

FIG. 1 is a perspective view showing a multilayer ceramic capacitor according to a first embodiment of the present invention. FIG. 2A is a cross-sectional view of the multilayer ceramic capacitor taken along line B1-B2 in FIG. 1. FIG. 2B is a cross-sectional view of the multilayer ceramic capacitor taken along line B3-B4 in FIG. 1. FIG. 3 is a cross-sectional view of the multilayer ceramic capacitor taken along line C1-C2 in FIG. 1. FIG. 4 is a cross-sectional view of the multilayer ceramic capacitor taken along line A1-A2 in FIG. 1.

As shown in FIGS. 1, 2A, 2B, 3, and 4, the multilayer ceramic capacitor 1A includes an element body (element assembly) 2 and external electrodes (outer electrodes) 6A and 6B. The element body 2 has a laminate (or stack) 2A, a lower cover layer 5A, and an upper cover layer 5B. The laminate 2A has internal electrode layers (inner electrode layers) 3A, other internal electrode layers 3B, and dielectric layers 4 interposed between neighboring internal electrode layers 3A and 3B.

In FIGS. 2A, 2B, and 3, the boundaries between the lower cover layer 5A and the laminate 2A and the upper cover layer 5B and the laminate 2A are denoted in dotted line, but the boundaries after sintering that will be described later cannot be identified.

The lower surface of the laminate 2A is covered with the lower cover layer 5A, and the upper surface of the laminate 2A is covered with the upper cover layer 5B. The internal electrode layers 3A and 3B are alternately stacked in such a manner that the dielectric layers 4 are interposed therebetween. Although FIGS. 1, 2A, 2B, and 3 show an example in which seven internal electrode layers 3A and 3B are stacked in total, the number of stacked internal electrode layers 3A and 3B is not limited.

In the following description, the direction perpendicularly passing through the end surfaces MA and MB of the element body 2 may be referred to as a longitudinal direction DL of the element body 2, the direction perpendicular to the longitudinal direction DL and parallel to the internal electrode layers 3A and 3B may be referred to as a width direction DW of the element body 2, and the direction perpendicular to the longitudinal direction DL and the width direction DW may be referred to as a stacking direction (height direction) DH of the element body 2.

The internal electrode layers 3A and 3B are stacked in the height direction DH in such a manner that the dielectric layers 4 are interposed therebetween. The left end surface MA is opposite to the right end surface MB in the longitudinal direction DL.

The multilayer ceramic capacitor 1A is mounted on a circuit substrate and is used for purposes including eliminating noise applied to semiconductor chips mounted on the circuit substrate.

A pair of opposite surfaces of the element body 2 that are substantially parallel to the circuit substrate may be referred to as a top surface TS and a bottom surface BS. In addition, a pair of opposite surfaces of the element body 2 that are substantially perpendicular to the circuit substrate and at which the internal electrode layers 3A and 3B are not exposed may be referred to as a pair of side surfaces SA and SB. The width direction DW substantially perpendicularly passes through the side surfaces SA and SB of the element body 2.

In the specification, the terms, "top surface", "bottom surface", "side surfaces", "height", "thickness", "width", etc. are used for ease of understanding and are not intended to limit the orientation of the multilayer ceramic capacitor 1A when it is mounted on the circuit substrate.

As shown in FIG. 4, the side surfaces SA and SB of the element body 2 are concavely curved along the longitudinal direction DL, so that the element body 2 has a central part C1 in the longitudinal direction DL, at which the width W1 is less than the width W3 at the end surfaces MA and MB. This means that at least any portion of the central part C1 in the longitudinal direction DL is the narrowest in comparison with other parts in the longitudinal direction DL, in which the widths are compared at the same level of height.

In the illustrated embodiment, the interval between the side surfaces SA and SB of the element body 2 (the width of the element body 2) gradually decreases toward points Q1 and Q1' of the side surfaces SA and SB in the central part C1 from the end surfaces MA and MB. Each side surface may be axially symmetrical about a center line Ce1 of the element body 2 shown in FIG. 4 that is located at the middle of the element body 2 in the longitudinal direction DL and that passes along the width direction DW.

The longitudinal central part C1 is defined as, for example, a middle part of the element body 2 in the longitudinal direction DL in a case in which the element body 2 is divided into (2N+1) equal parts in the longitudinal direction DL, in which N is a positive integer. For example, the longitudinal central part C1 is defined as a middle part of the element body 2 in the longitudinal direction DL in a case in which the element body 2 is divided into three equal parts in the longitudinal direction DL.

As shown in FIGS. 2A and 2B, the side surfaces SA and SB of the element body 2 are concavely curved along the height direction DH, so that the element body 2 has central parts CA3 and CB3 in the height direction DH, at which the width is less than those of other parts. Each side surface may be axially symmetrical about center lines Ce2 and Ce3 of the element body 2 shown in FIGS. 2A and 2B that are located at the middle of the element body 2 in the height direction DH and that passes along the width direction DW.

As will be understood from comparison of FIGS. 2A and 2B, the radius of curvature of each side surface along the height direction DH is the minimum at the longitudinal central part C1 and may gradually increase toward the longitudinal ends of the element body 2. The aforementioned points Q1 and Q1' in FIG. 4 are points that have the minimum radius of curvature of each side surface along the height direction DH and are located within the central part C1. The concavely curved shapes of the side surfaces may also be axially symmetrical about the center line Ce1 of the element body 2 shown in FIG. 4.

As shown in FIG. 2B, the width W1 at the central part C1 of the element body 2 is exactly defined as the width at the longitudinal central part C1 at the center in the height direction DH. As shown in FIG. 2A, the width W3 at the end surfaces MA and MB of the element body 2 is exactly defined as the width at the end surfaces MA and MB at the center in the height direction DH.

As will be described below, it is preferable that $0 < (W3-W1)/W3 \le 0.15$, and it is more preferable that $0.04 < (W3-W1)/W3 \le 0.12$.

As shown in FIG. 3, the top surface TS and the bottom surface BS of the element body 2 are convexly curved along the longitudinal direction DL, so that the element body 2 has a central part C2 in the longitudinal direction DL, at which a thickness (height) T1 is greater than the thickness (height) T3 at the end surfaces MA and MB. This means that at least any portion of the central part C2 in the longitudinal direction DL is the thickest in comparison with other parts in the longitudinal direction DL, in which the thicknesses are compared at the same vertical plane.

In the illustrated embodiment, the interval between the top surface TS and the bottom surface BS of the element body 2 (the thickness of the element body 2) gradually increases toward the longitudinal center from the end surfaces MA and MB.

The longitudinal central part C2 is defined as, for example, a middle part of the element body 2 in the longitudinal direction DL in a case in which the element body 2 is divided into (2N+1) equal parts in the longitudinal direction DL, in which N is a positive integer. For example, the longitudinal central part C2 is defined as a middle part of the element body 2 in the longitudinal direction DL in a case in which the element body 2 is divided into three equal parts in the longitudinal direction DL. The central part C2 may or may not coincide with the central part C1.

As will be apparent from above, the element body 2 has the top surface TS and the bottom surface BS that are convexly curved along the longitudinal direction DL and has the central part C2 that is thicker than the end surfaces MA and MB. Each of the top and bottom surfaces may be axially symmetrical about a center line Ce4 of the element body 2 shown in FIG. 3 that is located at the middle of the element body 2 in the longitudinal direction DL and that passes along the height direction DH.

In the cross-section shown in FIG. 3, the thickest portion of the element body 2 is located in the central part C2.

In FIGS. 2A and 2B, in the cross-sections of the element body 2 parallel to the end surfaces MA and MB, the central parts in the height direction DH at the ends of the longitudinal direction DL of the element body 2 will be referred to as central parts CA3, and the central part in the height direction DH at the center in the longitudinal direction DL of the element body 2 will be referred to as a central part CB3. In addition, in the cross-sections of the element body 2 parallel to the end surfaces MA and MB, the central parts in the width direction DW at the ends of the longitudinal direction DL of the element body 2 will be referred to as central parts CA4, and the central part in the width direction DW at the center in the longitudinal direction DL of the element body 2 will be referred to as a central part CB4.

Since the side surfaces SA and SB of the element body 2 are concavely curved along the longitudinal direction DL (since the width W1 at the longitudinal central part of the element body 2 is less than the width W3 at the longitudinal ends), the width at the elevational central part CB3 at the longitudinal center of the element body 2 is less than the width at the elevational central parts CA3 of the longitudinal ends of the element body 2. This means that at least any portion of the central part CB3 in the height direction DH in the longitudinal central part is the narrowest in comparison with other parts in the longitudinal direction DL, in which the widths are compared at the same level of height, for example, at the middle level of height.

The elevational central part CB3 is defined as, for example, a middle part of the element body 2 in the height direction DH in a case in which the element body 2 is divided into (2N+1) equal parts in the height direction DH, in which N is a positive integer. For example, the elevational central part CB3 is defined as a middle part of the element body 2 in the height direction DH in a case in which the element body 2 is divided into three equal parts in the height direction DH.

Since the top surface TS and the bottom surface BS of the element body 2 are convexly curved along the longitudinal direction DL (since the thickness T1 at the longitudinal central part of the element body 2 is greater than the thickness T3 at the longitudinal ends), the thickness at the lateral central part CB4 at the longitudinal center of the element body 2 is greater than the thickness at the lateral central parts CA4 of the longitudinal ends of the element body 2. This means that at least any portion of the central part CB3 in the width direction DW in the longitudinal central part is the thickest in comparison with other parts in the longitudinal direction DL, in which the thicknesses are compared at the same lateral position, for example, at the middle in the width direction DW.

The lateral central part CB4 is defined as, for example, a middle part of the element body 2 in the width direction DW in a case in which the element body 2 is divided into (2N+1) equal parts in the width direction DW, in which N is a positive integer. For example, the elevational central part CB3 is defined as a middle part of the element body 2 in the width direction DW in a case in which the element body 2 is divided into three equal parts in the width direction DW.

As shown in FIGS. 2A and 2B, the element body 2 has the top surface TS and the bottom surface BS that are convexly curved along the width direction DW and has the lateral central parts CA4 and CB4 that are thicker than the lateral sides of the element body 2. Each of the top and bottom surfaces may be axially symmetrical about center lines Ce5 and Ce6 of the element body 2 shown in FIGS. 2A and 2B that are located at the middle of the element body 2 in the width direction DW and that pass along the height direction DH.

As will be understood from comparison of FIGS. 2A and 2B, the radius of curvature of each of the top and bottom surfaces along the width direction DW is the minimum at the longitudinal central part C1 or C2 and may gradually increase toward the longitudinal ends of the element body 2. The aforementioned points Q1 and Q1' in FIG. 4 are points that have the minimum radius of curvature of each of the top and bottom surfaces along the width direction DW and are located within the central part C1 or C2. The convexly curved shapes of the top and bottom surfaces may also be axially symmetrical about the center line Ce1 of the element body 2 shown in FIG. 4.

As shown in FIG. 2B, the thickness T1 at the longitudinal center part C1 or C2 of the element body 2 is exactly defined as the thickness at the central part CB4 in the width direction DW in the cross-section at the longitudinal central part C1 or C2 of the element body 2. The thickness at the lateral sides of the element body 2 in the width direction DW in the cross-section at the longitudinal central part C1 or C2 of the element body 2 will be referred to as a thickness T2. The width W1 at the longitudinal center part C1 or C2 of the element body 2 is exactly defined as the width at the central part CB3 in the height direction DH in the cross-section at the longitudinal central part C1 or C2 of the element body 2. The width at the upper edges and lower edges in the height direction DH in the cross-section at the longitudinal central part C1 or C2 of the element body 2 will be referred to as a width W2.

It is preferable that $3.5 \leq [(W2-W1)/W2]/[(T1-T2)/T2] \leq 30$, and it is more preferable that $5.5 \leq [(W2-W1)/W2]/[(T1-T2)/T2] \leq 20$. In the inequalities, W2 may be the width at the upper edges and lower edges in the cross-section at the longitudinal central part C1 or C2 of the element body 2 or may be the width at the upper edges or lower edges in the cross-section at the longitudinal central part C1 or C2 of the element body 2.

The contour of the element body 2 shown in FIGS. 2A, 2B, 3, and 4 can be confirmed by observing cut planes obtained by cutting along the cross sections of FIGS. 2A, 2B, 3, and 4 and by polishing the cut planes. The aforementioned dimensions of the element body 2 can also be confirmed by measuring them in the cut planes.

The external electrodes 6A and 6B are located on opposite ends of the element body 2, respectively, so that the external electrodes 6A and 6B are spaced apart (separated) from each other in the longitudinal direction DL. Each of the external electrodes 6A and 6B continuously covers the top surface TS, the bottom surface BS, the side surfaces SA and SB, and the corresponding end surface MA or MB of the element body 2.

As shown in FIG. 3, in the longitudinal direction DL, the internal electrode layers 3A and 3B are arranged alternately at different positions in the laminate 2A. The internal electrode layers 3A can be closer to the left end surface MA of the element body 2 than the internal electrode layers 3B, whereas the internal electrode layers 3B can be closer to the right end surface MB of the element body 2 than the internal electrode layers 3A.

Left ends of the internal electrode layers 3A are exposed at the left ends of the dielectric layers 4 in the left end surface MA and are connected to the external electrode 6A. Right ends of the internal electrode layers 3B are exposed at the right ends of the dielectric layers 4 in the right end surface MB and are connected to the external electrode 6B.

On the other hand, as shown in FIG. 4, in the width direction DW, sides of the internal electrode layers 3A and 3B are covered with the dielectric material that forms the dielectric layers 4. In the width direction DW, both sides of the internal electrode layers 3A may be aligned with both sides of the internal electrode layers 3B.

Accordingly, the element body 2 has side margin portions 10 made of the dielectric material and covering the internal electrode layers 3A and 3B in the width direction DW. The element body 2 may be chamfered along the respective ridges of the element body 2.

The thickness of the internal electrode layers 3A and 3B may be in a range from 0.2 micrometers to 0.8 micrometers.

The main component of the material for the internal electrode layers 3A and 3B may be a metal, for example, Cu (copper), Fe (iron), Zn (zinc), Sn (tin), Ni (nickel), Ti (titanium), Ag (silver), Au (gold), Pt (platinum), Pd (palladium), Ta (tantalum), or W (tungsten), or may be an alloy containing at least one of the metals. It is preferable that the main component of the material for the internal electrode layers 3A and 3B be Ni or Cu.

The thickness of the dielectric layers 4 may be in a range from 0.2 micrometers to 0.5 micrometers. An average crystal grain diameter of the dielectric contained in the dielectric layer 4 may be in a range from 80 nanometers to 200 nanometers.

The main component of the material for the dielectric layers 4 may be, for example, a ceramic material having a perovskite structure. The main component may be contained in a ratio of 50 at % or more. The ceramic material of the dielectric layers 4 may be, for example, barium titanate, strontium titanate, calcium titanate, magnesium titanate, barium strontium titanate, barium calcium titanate, calcium zirconate, barium zirconate, calcium titanate zirconate, barium calcium zirconate titanate, or titanium oxide.

The main component of the material for the lower cover layer 5A and the upper cover layer 5B may be, for example, a ceramic material. The main component of the ceramic material of the lower cover layer 5A and the upper cover layer 5B may be the same as the main component of the ceramic material of the dielectric layers 4.

The convexly curved shapes of the top surface TS and the bottom surface BS of the element body 2 and the concavely curved shapes of the side surfaces SA and SB of the element body 2 can be obtained by distribution of internal stress exerted in the element body 2, which is caused by a difference between the shrinkage temperature of the laminate 2A (see FIGS. 2A and 3) and the shrinkage temperature of the cover layers 5A and 5B during sintering the element body 2 that will be described later. In a case in which the difference is increased, the internal stress exerted in the element body 2 is also increased, so that the curvatures of the convex shapes and the concave shapes are also increased.

To change the shrinkage temperature of the cover layers 5A and 5B, the crystal grain diameter of the dielectric (ceramic) material contained in the cover layers 5A and 5B may be varied, the amount of a glass phase additive in the material for the cover layers 5A and 5B (e.g., Si) may be varied, and the amount of a binder mixed into the material of the cover layers 5A and 5B may be varied.

The main component of the material for the external electrodes 6A and 6B may be a metal, for example, Cu, Fe, Zn, Al, Ni, Pt, Pd, Ag, Au, or Sn, or may be an alloy containing at least one of the metals. It is preferable that the main component of the material for the external electrodes 6A and 6B be Ni in light of electric connectivity with the internal electrodes 3A and 3B.

Figure 6A:
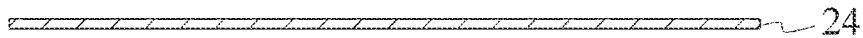
FIGS. 6A to 6I are cross-sectional views used for describing the method of manufacturing the multilayer ceramic capacitor according to the first embodiment.
Figure 6B:
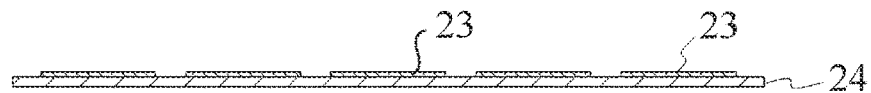
Figure 6C:
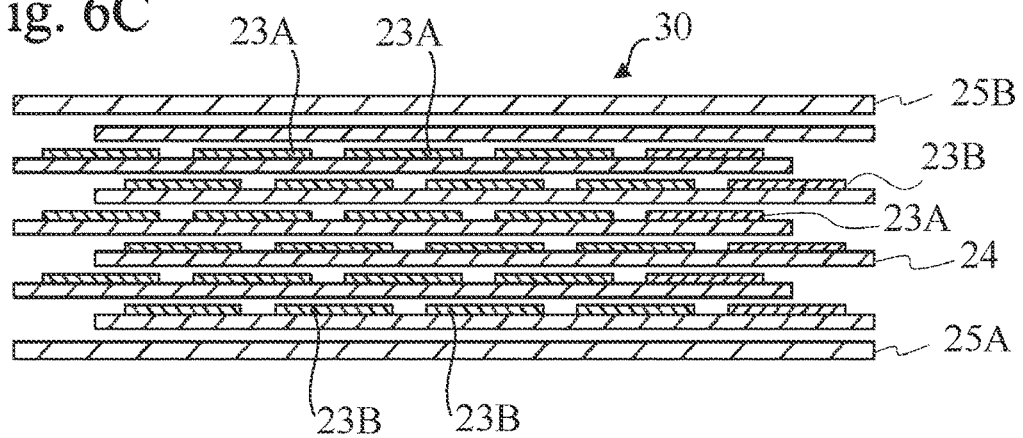
Figure 6D:
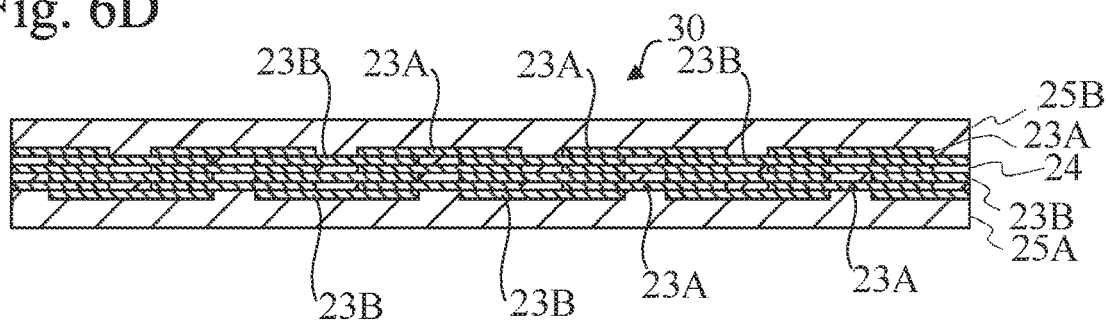
Figure 6E:
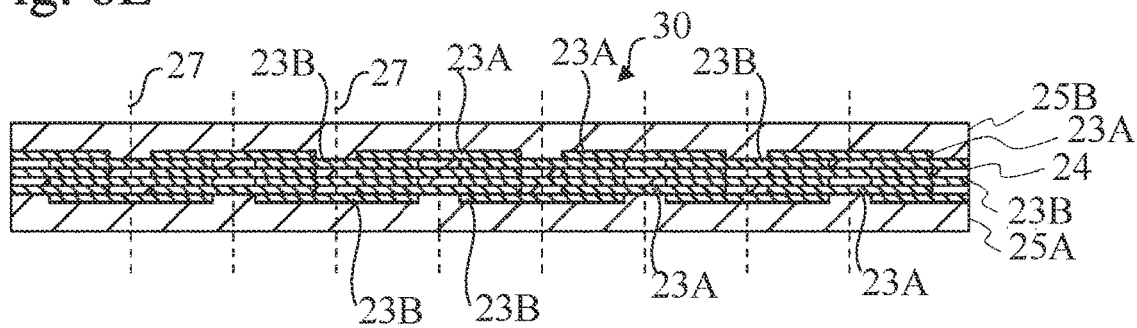
Figure 6F:
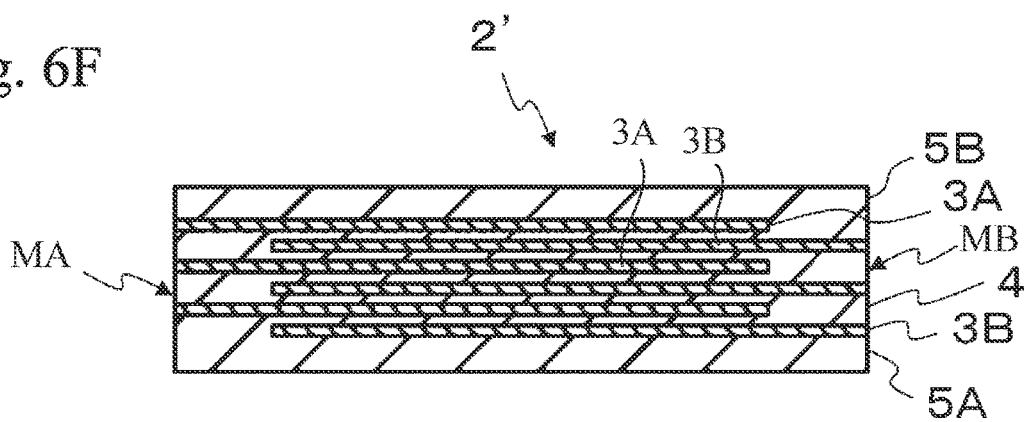
Figure 6G:
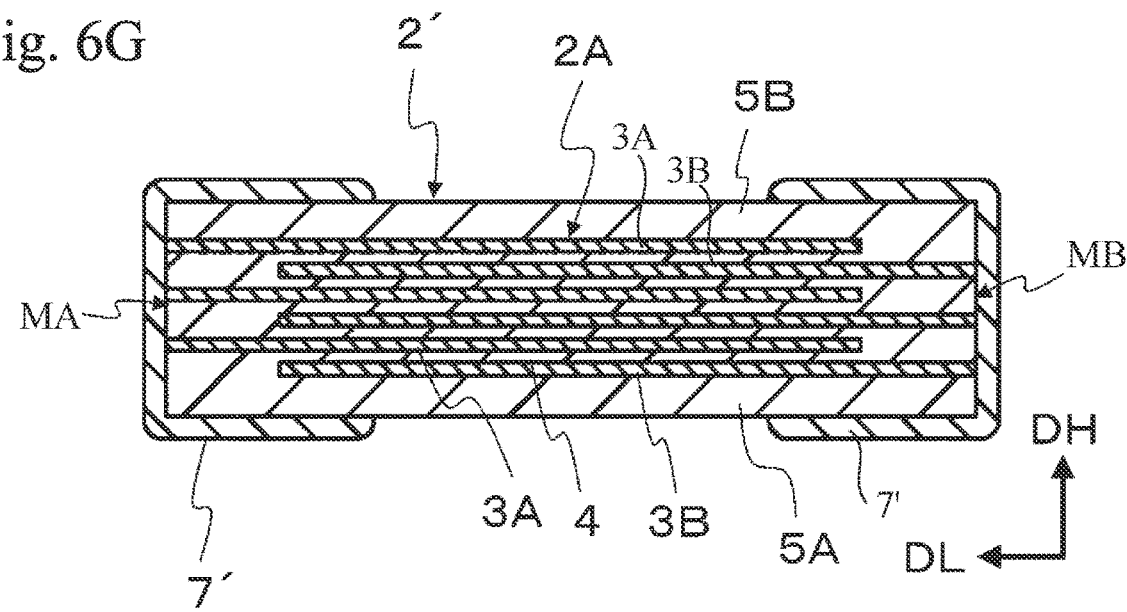
Figure 6H:
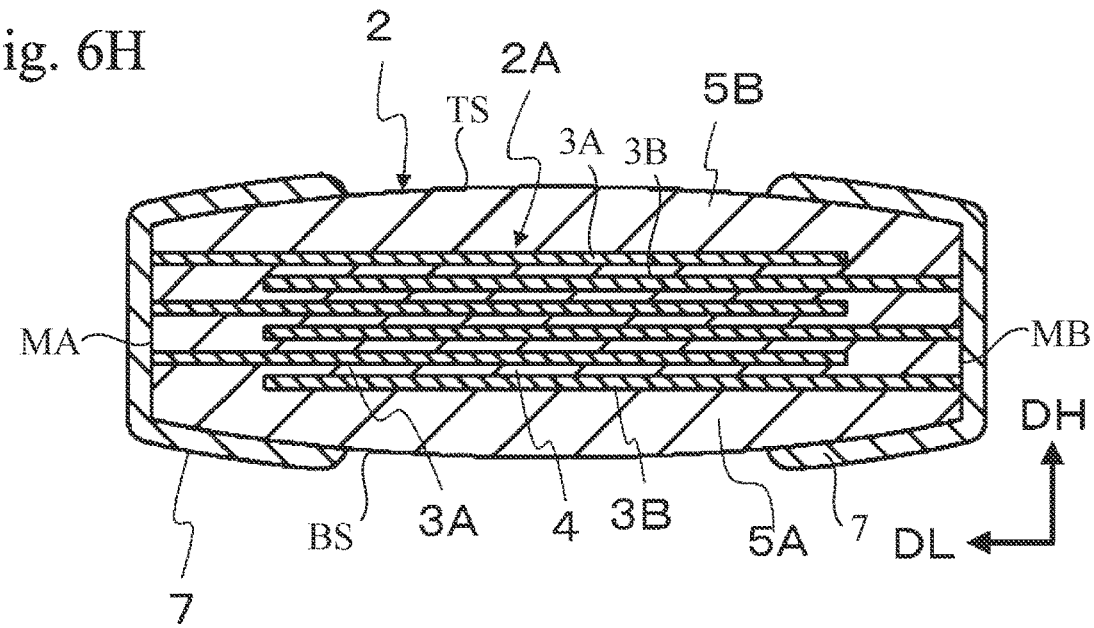
Figure 6I:
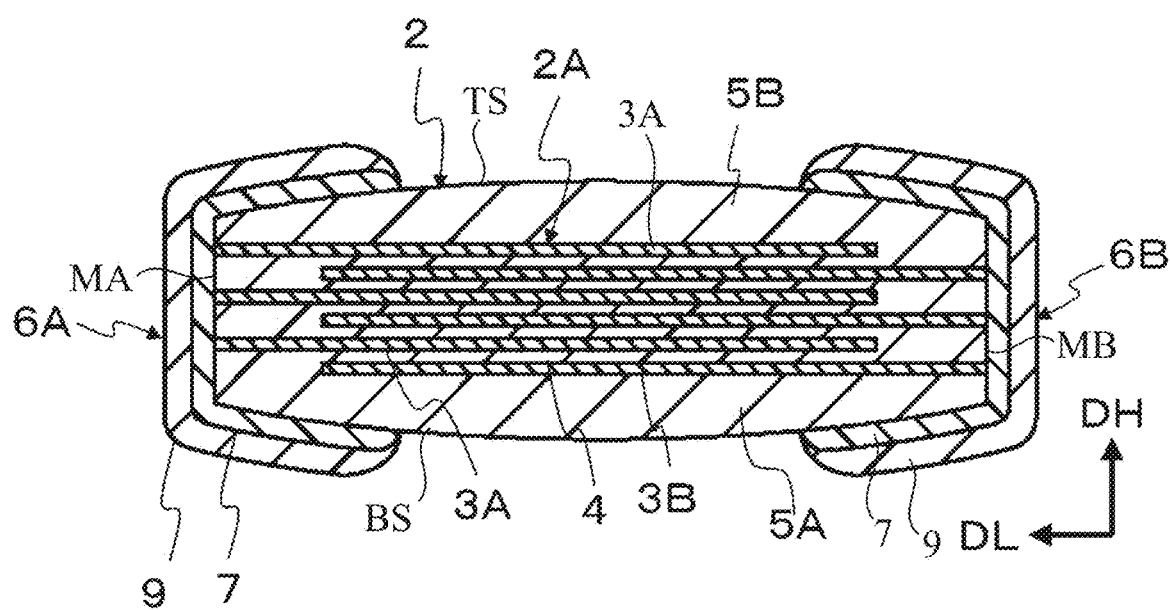

As shown in FIG. 6I, each of the external electrodes 6A and 6B has a base layer 7 as an electroconductive layer formed on the element body 2 and a plating layer 9 formed on the base layer 7.

The base layers 7 of the external electrodes 6A and 6B are located on opposite ends of the element body 2, respectively, so that the base layers 7 of the external electrodes 6A and 6B are spaced apart (separated) from each other in the longitudinal direction DL. The base layer 7 of each of the external electrodes 6A and 6B continuously covers the top surface TS, the bottom surface BS, the side surfaces SA and SB, and the corresponding end surface MA or MB of the element body 2.

The electrical conductive material for the base layer 7 may be a metal, for example, Cu, Fe, Zn, Al, Ni, Pt, Pd, Ag, Au, and Sn, or may be an alloy containing at least one of the metals. The base layer 7 may further include co-material particles dispersed in the metal. Here, the term "particle" is meant to include not only an individual small particle, but also a block formed by a combination of multiple small particles after the sintering process, which will be described later. The co-material dispersed like islands in the base layer 7 reduces the difference in thermal expansion coefficients of the element body 2 and the base layer 7 to alleviate thermal stress exerted in the base layer 7. The co-material is, for example, a ceramic component that is the main component of the material for the dielectric layers 4. The base layer 7 may also include a glass component. The glass component in the base layer 7 can densify the base layer 7. The glass component may be, for example, an oxide of Ba (barium), Sr (strontium), Ca (calcium), Zn, Al, Si (silicon), B (boron), or the like.

The base layer 7 is preferably formed of a sintered body of an electroconductive paste containing metal. This makes it possible to make the base layer 7 thicker while ensuring adhesion between the element body 2 and the base layer 7, so that the strength of the external electrodes 6A and 6B is ensured and the electric conductivity of the base layers 7 and the internal electrode layers 3A and 3B is ensured.

The plating layer 9 of each of the external electrodes 6A and 6B continuously covers the corresponding base layer 7. The plating layer 9 is electrically connected with the internal electrode layers 3A or 3B through the corresponding base layer 7. In addition, the plating layer 9 of each of the external electrodes 6A and 6B is electrically connected with an electrode on a circuit substrate via solder.

The material for the plating layer 9 may be a metal, for example, Cu, Fe, Zn, Al, Ni, Pt, Pd, Ag, Au, Sn, or the like, or may be an alloy containing at least one of the metals. The plating layer 9 may be a single layer of a single metal component or multiple layers of different metal components.

The plating layer 9 of each of the external electrodes 6A and 6B may have a three-layered structure consisting of, for example, a Cu plating layer formed on the base layer 7, a Ni plating layer formed on the Cu plating layer, and a Sn plating layer formed on the Ni plating layer. The Cu plating layer can improve the adhesiveness of the plating layer 9 to the base layer 7, and the Ni plating layer can improve the heat resistance of the external electrode 6A and 6B during soldering. The Sn plating layer can improve the wettability of the solder for the plating layer 9.

In the embodiment, since the side surfaces SA and SB of the element body 2 are concavely curved along the longitudinal direction DL as shown in FIG. 4, local residual stress in the laminate 2A (see FIGS. 2A and 2B), in particular, in regions RE (denoted by phantom lines in FIGS. 2A and 2B) near the boundary between the lower cover layer 5A and the laminate 2A and the boundary between the upper cover layer 5B and the laminate 2A, can be alleviated. Accordingly, it is unlikely for the cover layers 5A and 5B to separate from the laminate 2A, which prevent cracking in the element body 2, degradation of mechanical strength, degradation of insulation resistance, and degradation of reliability of the element body 2. The phenomenon in which the cover layers 5A and 5B separate from the laminate 2A is referred to as delamination.

In addition, by adjusting the crystal grain diameter of the dielectric (ceramic) material contained in the cover layers 5A and 5B, the amount of a glass phase additive and/or the amount of a binder contained in the cover layers 5A and 5B, the convexly curved shapes of the top surface TS and the bottom surface BS of the element body 2 and the concavely curved shapes of the side surfaces SA and SB of the element body 2 can be obtained. This eliminates the need to process the element body 2 after sintering to obtain the convexly curved shapes and the concavely curved shapes, thereby restricting increase in the cost of the element body 2.

The external size of the multilayer ceramic capacitor 1A is preferably in a range from "0201" according to the Japanese Industrial Standards (JIS) (length=0.25 mm, width=0.125 mm, height=0.125 mm) to "3225" according to the JIS (length=3.2 mm, width=2.5 mm, height=2.5 mm). It is more preferable that the external size be in a range from "0201" to "0402" according to the JIS (length=0.4 mm, width=0.2 mm, height=0.2 mm). It is of note that the aforementioned dimensional values are design values, and the actual product has dimensional values that may include dimensional tolerances. In a case in which the external size of the multilayer ceramic capacitor 1A is in a range from "0201" to "0402", the multilayer ceramic capacitor 1A can be made smaller with a high capacitance.

The capacitance of the multilayer ceramic capacitor 1A is preferably in a range from 10 µF to 1000 µF. It is more preferable that the capacitance of the multilayer ceramic capacitor 1A be in a range from 470 µF to 1000 µF. In a case in which the capacitance of the multilayer ceramic capacitor 1A is in a range from 470 µF to 1000 µF, the multilayer ceramic capacitor 1A can be made smaller and can be used for a smoothing capacitor in a power supply circuit, and the ripple current can be effectively reduced.

FIG. 5 is a flowchart showing an example of a method of manufacturing a multilayer ceramic capacitor according to the first embodiment. FIGS. 6A to 6I are cross-sectional views showing an exemplary method of manufacturing the multilayer ceramic capacitor according to the first embodiment. For the sake of illustration, FIG. 6C to FIG. 6I show only three internal electrode layers 3A and three internal electrode layers 3B laminated alternately in such a manner that the dielectric layers 4 are interposed therebetween.

In Step S1 of FIG. 5 (mixing step), an organic binder and an organic solvent, as a dispersant and a forming aid, are added to a dielectric material powder, and pulverized and mixed to produce a slurry. The dielectric material powder includes, for example, a ceramic powder. The dielectric material powder may include an additive or additives. The additive(s) may be, for example, an oxide of Mg (magnesium), Mn (manganese), V (vanadium), Cr (chromium), Y (yttrium), Sm (samarium), Eu (europium), Gd (cadmium), Tb (terbium), Dy (dysprosium), Ho (holmium), Er (erbium), Tm (thulium), Yb (ytterbium), Co (cobalt), Ni, Li (lithium), B, Na (sodium), K (potassium), or Si, or glass. The organic binder is, for example, a polyvinyl butyral resin or a polyvinyl acetal resin. The organic solvent is, for example, ethanol or toluene.

Next, in Step S2 of FIG. 5 (slurry application step), as shown in FIG. 6A, a green sheet 24 is manufactured. Specifically, the slurry containing the ceramic powder is applied onto a carrier film in a sheet form and dried to manufacture the green sheet 24. The carrier film is, for example, a PET (polyethylene terephthalate) film. The application of the slurry can be conducted with the use of, for example, a doctor blade method, a die coater method, or a gravure coater method. Step S2 is repeated to prepare a plurality of green sheets 24.

Next, in Step S3 of FIG. 5 (electrode printing step), as shown in FIG. 6B, an electroconductive paste, which will become an internal electrode layer, is applied in a predetermined pattern onto each of the green sheets 24, on which internal electrode layers 3A or 3B shown in FIG. 2B are to be placed, among the green sheets prepared in Step S1 to form internal electrode patterns 23 on the green sheets 24. In Step S3, it is possible to form a plurality of internal electrode patterns 23 on each single green sheet 24 such that the internal electrode patterns 23 are separated from each other in the longitudinal direction of the green sheet 24.

The electroconductive paste for the internal electrode layers includes a powder of the metal used as the material of the internal electrode layers 3A and 3B. For example, if the metal used as the material of the internal electrode layers 3A and 3B is Ni, the conductive paste for the internal electrode layers includes a powder of Ni. The conductive paste for the internal electrode layers also includes a binder, a solvent, and, if necessary, an auxiliary agent. The conductive paste for the internal electrode layers may include, as a co-material, a ceramic material having a main component that has the same composition as that of the main component of the material of the dielectric layers 4.

The application of the conductive paste for the internal electrode layers may be conducted with the use of a screen-printing method, an inkjet printing method, or a gravure printing method. Thus, Step S3 may be referred to as an electrode printing step. In this manner, a plurality of green sheets 24 that have the internal electrode patterns 23 thereon are prepared.

Next, in Step S4 of FIG. 5 (laminating step), as shown in FIG. 6C, the green sheets 24 on which the internal electrode patterns 23 are formed and the green sheets 25A and 25B on which the internal electrode patterns 23 are not formed are laminated in a predetermined order to create a block 30 of the green sheets. The green sheets 25A and 25B on which the internal electrode patterns 23 are not formed are used as the outer layers (the lower cover layer 5A and the upper cover layer 5B).

The green sheets 24 having the internal electrode patterns 23A or 23B thereon are classified into two groups, i.e., the green sheets 24 having the internal electrode patterns 23A (which will form the internal electrode layer 3A) thereon and the green sheets 24 having the internal electrode patterns 23B (which will form the internal electrode layer 3B) thereon. The green sheets 24 having the internal electrode patterns 23A thereon and the green sheets 24 having the internal electrode patterns 23B thereon are stacked alternately in the laminating direction such that the internal electrode patterns 23A on the green sheet 24 and the internal electrode patterns 23B on the next or adjacent green sheet 24 are alternately shifted in the longitudinal direction of the green sheet 24.

Furthermore, three types of portions are defined in the green sheet block 30. Specifically, the green sheet block 30 includes a portion in which only the internal electrode patterns 23A are stacked in the stacking direction, a portion in which the internal electrode patterns 23A and 23B are stacked alternately in the stacking direction, and a portion in which only the internal electrode patterns 23B are stacked in the stacking direction.

The green sheets 25A and 25B for the lower cover layer 5A and the upper cover layer 5B are thicker than the green sheets 24, on which the internal electrode patterns 23 are formed.

As described above, to change the shrinkage temperature of the cover layers 5A and 5B, the crystal grain diameter of the dielectric (ceramic) material contained in the cover layers 5A and 5B may be varied, the amount of a glass phase additive in the material for the cover layers 5A and 5B (e.g., Si) may be varied, and the amount of a binder mixed into the material of the cover layers 5A and 5B may be varied.

If the average crystal grain diameter of the dielectric powder contained in the green sheets 25A and 25B is greater than the average crystal grain diameter of the dielectric powder contained in the green sheets 24, the shrinkage temperature of the cover layers 5A and 5B can be adjusted to be higher than the shrinkage temperature of the laminate 2A during sintering.

If the amount of the glass phase additive in the dielectric powder contained in the green sheets 25A and 25B is increased, the shrinkage temperature of the cover layers 5A and 5B can be adjusted to be lower during sintering.

If the amount of the binder in the dielectric powder contained in the green sheets 25A and 25B is increased, the distances between dielectric particles in the green sheets 25A and 25B before sintering is increased, so that solid solution of the dielectric particles during sintering can be slow down. This results in that the shrinkage temperature of the cover layers 5A and 5B is higher than the shrinkage temperature of the laminate 2A during sintering.

Next, in Step S5 of FIG. 5 (pressure bonding step), as shown in FIG. 6D, the laminate block 30 obtained in the laminating step of Step S4 of FIG. 5 is pressed such that the green sheets 24, 25A, and 25B are pressure-bonded. Pressing the laminate block 30 may be conducted by, for example, hydrostatically pressing the laminate block 30, which may be surrounded by a resin film.

In Step S6 of FIG. 5 (cutting step), as shown in FIG. 6E, the pressed laminate block 30 is cut such that the block 30 is separated into a plurality of element bodies, each of which has a rectangular parallelepiped shape. Each element body has six surfaces. The cutting of the laminate block 30 is conducted at the portions in which only the internal electrode patterns 23A are stacked in the stacking direction, and the portions in which only the internal electrode patterns 23B are stacked in the stacking direction, as indicated by a plurality of vertical broken lines 27. The cutting of the laminate block 30 may be conducted by, for example, blade dicing or a similar method.

The resulting element body 2' is shown in an enlarged manner in FIG. 6F. As illustrated in FIG. 6F, the internal electrode layers 3A and 3B are alternately laminated in such a manner that the dielectric layers 4 are interposed therebetween in each of the individual element bodies 2'. The internal electrode layers 3A are exposed on one end surface MA of each element body 2', and the internal electrode layers 3B are exposed on the other end surface MB of each element body 2'.

The lower cover layer 5A and the upper cover layer 5B are formed in each element body 2'.

Next, in Step S7 of FIG. 5 (binder removing step), the binder contained in each of the element bodies 2' separated in Step S6 of FIG. 5 is removed. The removal of the binder is conducted by, for example, heating the element bodies 2' in an N2 atmosphere at about 350 degrees Celsius.

Next, in Step S8 of FIG. 5 (step of applying a paste for the base layers), as shown in FIG. 6G, an electroconductive paste 7' for the base layers (underlayers) 7 is applied to both end surfaces MA and MB of each element body 2 from which the binder is removed in Step S7 and is also applied to the remaining four surfaces (top surface, bottom surface, and side surfaces) of the element body 2, which are adjacent to the respective end surfaces MA and MB. For example, a dipping method can be used to apply the conductive paste 7' for the base layers. Then, the conductive paste 7' is dried.

The conductive paste 7' for the base layers 7 contains a powder or filler of the metal used as the conductive material of the base layers 7. For example, when the metal used as the conductive material of the base layers 7 is Ni, the conductive paste 7' for the base layers includes a powder or filler of Ni. The conductive paste 7' for the base layers also contains, as the co-material, a ceramic component, which is the main component of the material of the dielectric layers 4, for example. Particles of oxide ceramics mainly composed of barium titanate (e.g., 0.1 micrometers to 4 micrometers in D50 particle diameter), for example, are mixed in the conductive paste 7' for the base layers, as the co-material. The conductive paste 7' for the base layers further contains a binder and a solvent.

However, the conductive paste 7' for the base layers may be applied and sintered after the element body 2 is sintered (Step S9). In this case, the conductive paste 7' may be sintered, for example, in an N2 atmosphere at 780 degrees Celsius for ten minutes to thirty minutes.

Next, in Step S9 of FIG. 5 (sintering step), as shown in FIG. 6H, the element bodies 2, on which the conductive paste for the base layers 7 was applied in Step S8, undergo the sintering process such that the internal electrode layers 3A and 3B are integrated with the dielectric layers 4 in each element body 2 and the base layers 7 are integrated with the element body 2. The sintering of the element bodies 2 and the conductive paste 7' is conducted in, for example, a sintering furnace in a temperature range from 1000 degrees Celsius to 1400 degrees Celsius for ten minutes to two hours.

If a base metal such as Ni or Cu is used as the material of the internal electrode layers 3A and 3B, the sintering process may be conducted in the sintering furnace while the interior of the sintering furnace is kept to a reducing atmosphere in order to prevent oxidation of the internal electrode layers 3A and 3B.

As described above, in the sintering step, because of the difference between the shrinkage temperature of the laminate 2A and that of the cover layers 5A and 5B, the internal stress varies depending on locations in the element body 2, resulting in the convexly curved shapes of the top surface TS and the bottom surface BS of the element body 2 and the concavely curved shapes of the side surfaces SA and SB of the element body 2.

In the sintering step, some oxide components in the dielectric material in the element body 2 may be reduced, so that a re-oxidation step may be conducted after the sintering step. The re-oxidation step may be conducted in an N2 atmosphere in a temperature range from 600 degrees Celsius to 1000 degrees Celsius.

Next, in Step S10 of FIG. 5 (step of forming the plating layers), as shown in FIG. 6I, the plating layers 9 are formed on the base layers 7. In forming the plating layer 9, for example, the Cu plating layer, the Ni plating layer, and the Sn plating layer may be formed sequentially. The plating layers can be formed by that the element body 2, on which the base layers 7 are formed, is housed in a barrel and immersed in a plating solution in the barrel, and the barrel is rotated and energized.

Figure 7:
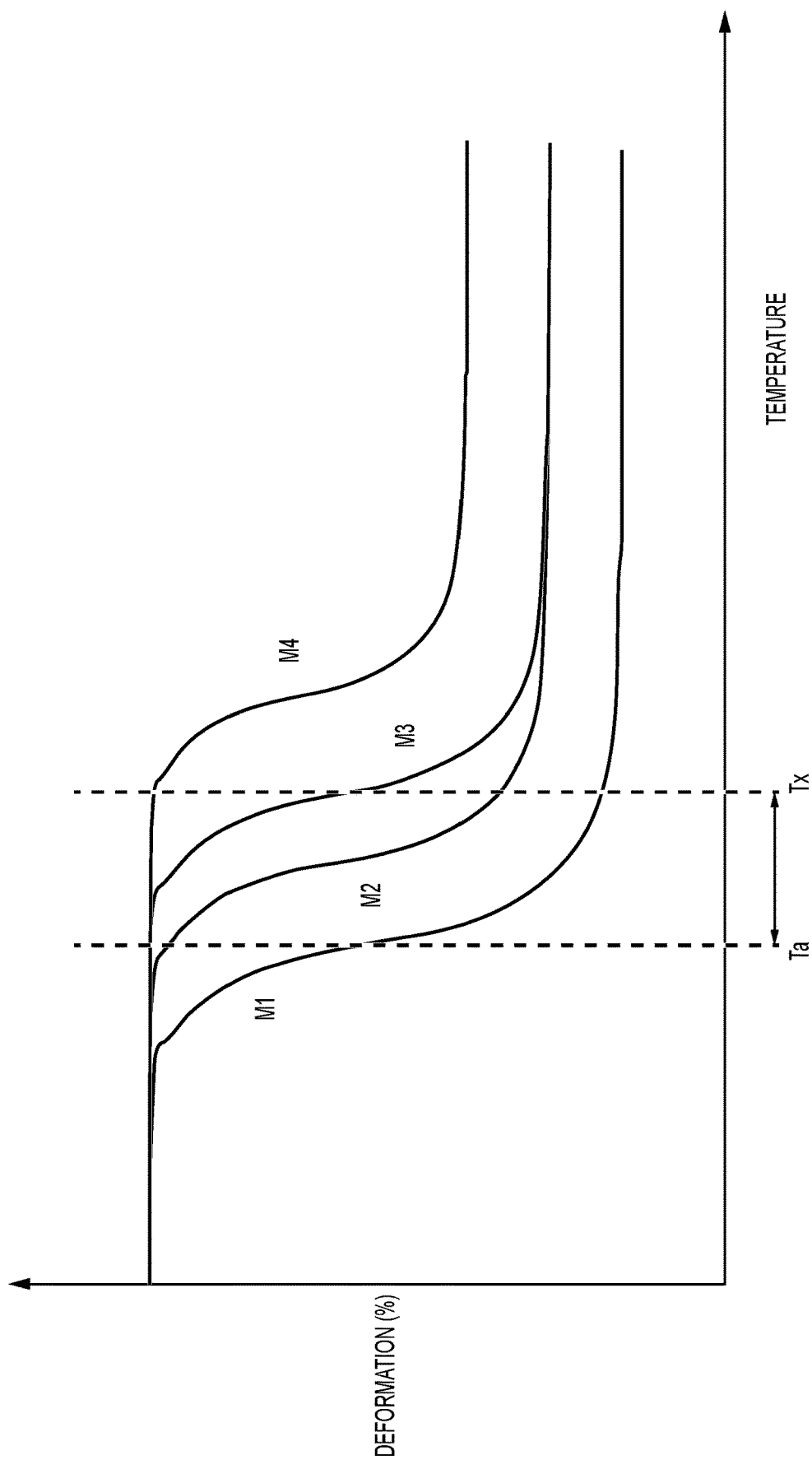
FIG. 7 is a graph showing relationship between temperature and deformation of each material of the multilayer ceramic capacitor according to the first embodiment when the temperature is raised.

FIG. 7 shows relationship between temperature and deformation of materials of the multilayer ceramic capacitor 1A according to the first embodiment when the temperature is raised. FIG. 7 is obtained by thermomechanical analysis (TMA) for materials of the multilayer ceramic capacitor 1A.

In the graph, curve M1 corresponds to the thermal shrinkage behavior of a material for the internal electrode layers 3A and 3B in the laminate 2A, and curves M2 to M4 correspond to the thermal shrinkage behaviors of different materials for the cover layers 5A and 5B.

As illustrated in each curve, shrinkage significantly increases due to the increase in temperature. The temperature at which shrinkage begins can be regarded as a shrinkage-start temperature, and the temperature at which the shrinkage ends can be regarded as a shrinkage-end temperature.

The temperature at which the shrinkage rate relative to change in temperature is the maximum (at which the inclination angle of the curve is the maximum) can be referred to as a shrinkage temperature. For curve M1, the shrinkage temperature of the material for the internal electrode layers 3A and 3B is Ta (degrees Celsius). For curve M3, the shrinkage temperature of the material for the cover layers 5A and 5B is Tx (degrees Celsius).

Since the shrinkage temperature of the cover layers 5A and 5B is higher than that of the internal electrode layers 3A and 3B, the internal electrode layers 3A and 3B begin to shrink before the cover layers 5A and 5B begin to shrink. Since the shrinkage of the internal electrode layers 3A and 3B occurs mainly in the width direction DW, the side surfaces SA and SB of the element body 2 are deformed to be curved concavely along the height direction DH, as shown in FIGS. 2A and 2B, so that an inner portion of the laminate 2A is significantly compressed. The compressive internal stress causes the top surface TS and the bottom surface BS of the element body 2 to be convexly curved along the width direction DW to release the compressive internal stress itself.

If the shrinkage temperature of the cover layers 5A and 5B is extremely high in comparison with that of the internal electrode layers 3A and 3B, the internal electrode layers 3A and 3B are shrunken earlier in comparison with the deformation of the cover layers 5A and 5B, and the stress in the laminate 2A increases. As a result, the concave curvature and the convex curvature of the external surfaces of the element body 2 are increased.

However, if the stress in the element body 2 is too high, durability of the element body 2 against mechanical and/or electrical fatigue decreases, and reliability of the multilayer ceramic capacitor 1A will be degraded.

On the other hand, if the shrinkage temperature of the cover layers 5A and 5B is too close to that of the internal electrode layers 3A and 3B, delamination is likely to occur between the laminate 2A and the cover layers 5A and 5B.

The inventors conducted experiments for confirming occurrence of delamination and reliability of different specimens of the multilayer ceramic capacitor 1A. Table 1 shows the shrinkage temperature Ta (degrees Celsius) of the material for the internal electrode layers 3A and 3B and the shrinkage temperature Tx (degrees Celsius) of the material for the cover layers 5A and 5B for each specimen. The specimens have various TA and various Tx. The shrinkage temperatures Ta and Tb were obtained by TMA.

Conditions in the TMA were as follows: the temperature rise rate was 10 degrees Celsius/min, and the atmosphere was a mixture of nitrogen (99%) and hydrogen (1%).

The reliability of the specimens was confirmed by testing durability (HALT (highly accelerated life test)) for the specimens.

TABLE 1

|  | SPECIMEN 1 | SPECIMEN 2 | SPECIMEN 3 | SPECIMEN 4 | SPECIMEN 5 | SPECIMEN 6 | SPECIMEN 7 | SPECIMEN 8 | SPECIMEN 9 |
|---|---|---|---|---|---|---|---|---|---|
| Ta (° C.) | 650 | 720 | 760 | 850 | 900 | 800 | 800 | 650 | 900 |
| Tx (° C.) | 1200 | 1200 | 1095 | 1150 | 1150 | 1100 | 1050 | 1220 | 1050 |
| Tx/Ta | 1.85 | 1.67 | 1.44 | 1.35 | 1.28 | 1.38 | 1.31 | 1.88 | 1.17 |

In Specimen 1, delamination occurred after the sintering process, but it was at a level that was not a problem. The durability test after production showed good results.

In Specimen 2, delamination occurred after the sintering process, but it was at a level that was not a problem. The durability test after production showed good results.

In Specimen 3, almost no delamination occurred after the sintering process. The durability test after production showed good results.

In Specimen 4, no delamination occurred after the sintering process. The durability test after production showed good results.

In Specimen 5, almost no delamination occurred after the sintering process. The durability test after production showed good results.

In Specimen 6, no delamination occurred after the sintering process. The durability test after production showed good results.

In Specimen 7, no delamination occurred after the sintering process. The durability test after production showed good results.

In Specimen 8, problematic delamination occurred after the sintering process. The durability test after production showed insufficient results.

In Specimen 9, problematic delamination occurred after the sintering process. The durability test after production showed good results.

From the aforementioned results of experiments, it is preferable that $1.20 \leq Tx/Ta \leq 1.85$, and it is more preferable that $1.30 \leq Tx/Ta \leq 1.60$. It is further preferable that $1.30 \leq Tx/Ta \leq 1.40$.

As described above, as shown in FIG. 4, the side surfaces SA and SB of the element body 2 are concavely curved along the longitudinal direction DL. As shown in FIG. 3, the top surface TS and the bottom surface BS of the element body 2 are convexly curved along the longitudinal direction DL. As shown in FIGS. 2A and 2B, the side surfaces SA and SB are concavely curved along the height direction DH and the top surface TS and the bottom surface BS are convexly curved along the width direction DW.

The preferable shapes of the top surface TS, the bottom surface BS, and the side surfaces SA and SB of the element body 2 can be obtained by adjusting at least one of (i) the crystal grain diameter of the dielectric (ceramic) material contained in the cover layers 5A and 5B, (ii) the amount of a glass phase additive in the material for the cover layers 5A and 5B, and (iii) the amount of a binder mixed into the dielectric powder contained in the cover layers 5A and 5B.

(i) If the crystal grain diameter of the dielectric material contained in the cover layers 5A and 5B is increased, the shrinkage-start temperature of the cover layers 5A and 5B during sintering can be raised, so that the amount of concave curvature of the side surfaces SA and SB that are concavely curved along the longitudinal direction DL (see FIG. 4) can be increased.

(ii) If the amount of the glass phase additive added to the dielectric material powder contained in the cover layers 5A and 5B is increased, the shrinkage-start temperature and the shrinkage temperature of the cover layers 5A and 5B during sintering can be lowered, so that the amount of concave curvature of the side surfaces SA and SB that are concavely curved along the longitudinal direction DL (see FIG. 4) can be decreased.

(iii) if the amount of the binder mixed into the dielectric powder contained in the cover layers 5A and 5B is increased, the shrinkage-start temperature of the cover layers 5A and 5B during sintering can be raised, so that the amount of concave curvature of the side surfaces SA and SB that are concavely curved along the longitudinal direction DL (see FIG. 4) can be increased, and the amount of convex curvature of the top surface TS and the bottom surface BS that are convexly curved along the longitudinal direction DL (see FIG. 3) can be increased.

Second Embodiment

Figure 8A:
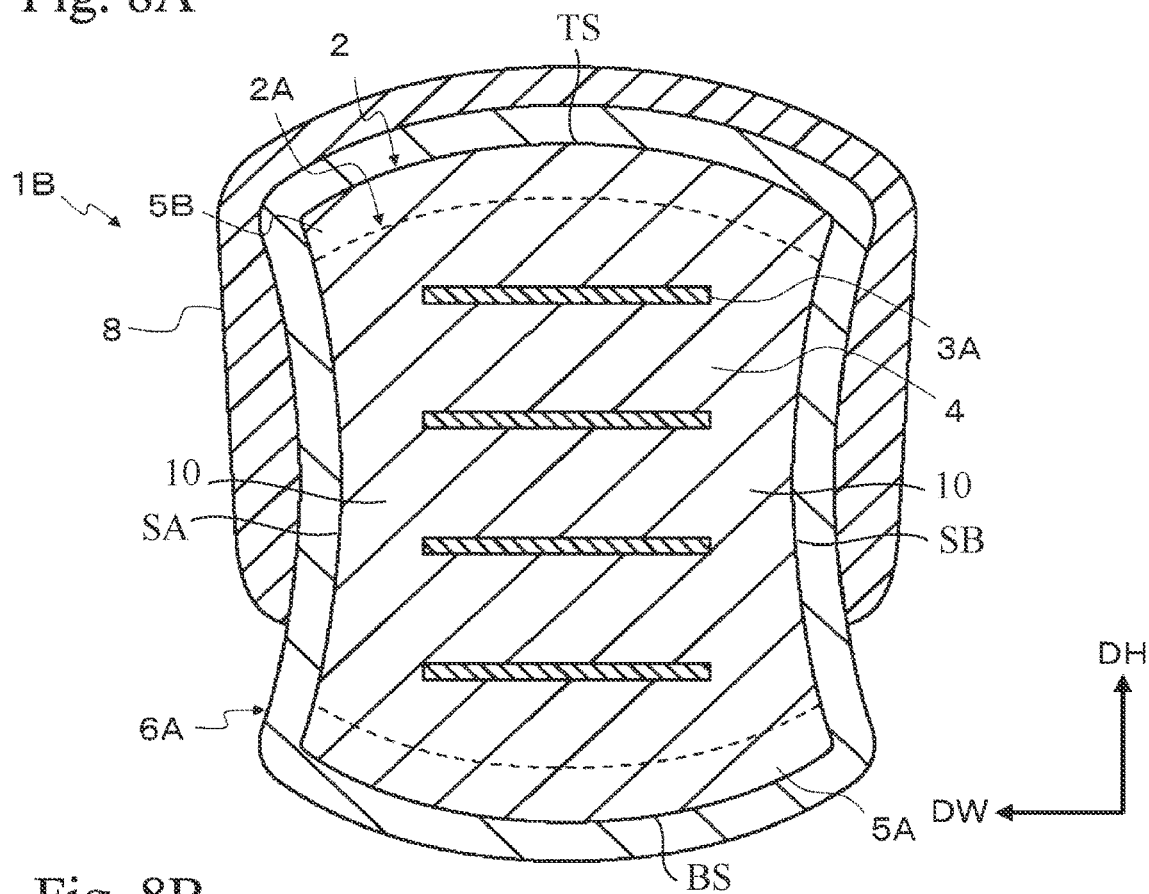
FIG. 8A is a cross-sectional view of a multilayer ceramic capacitor according to a second embodiment of the present invention taken in the same manner as in FIG. 2A.
Figure 8B:
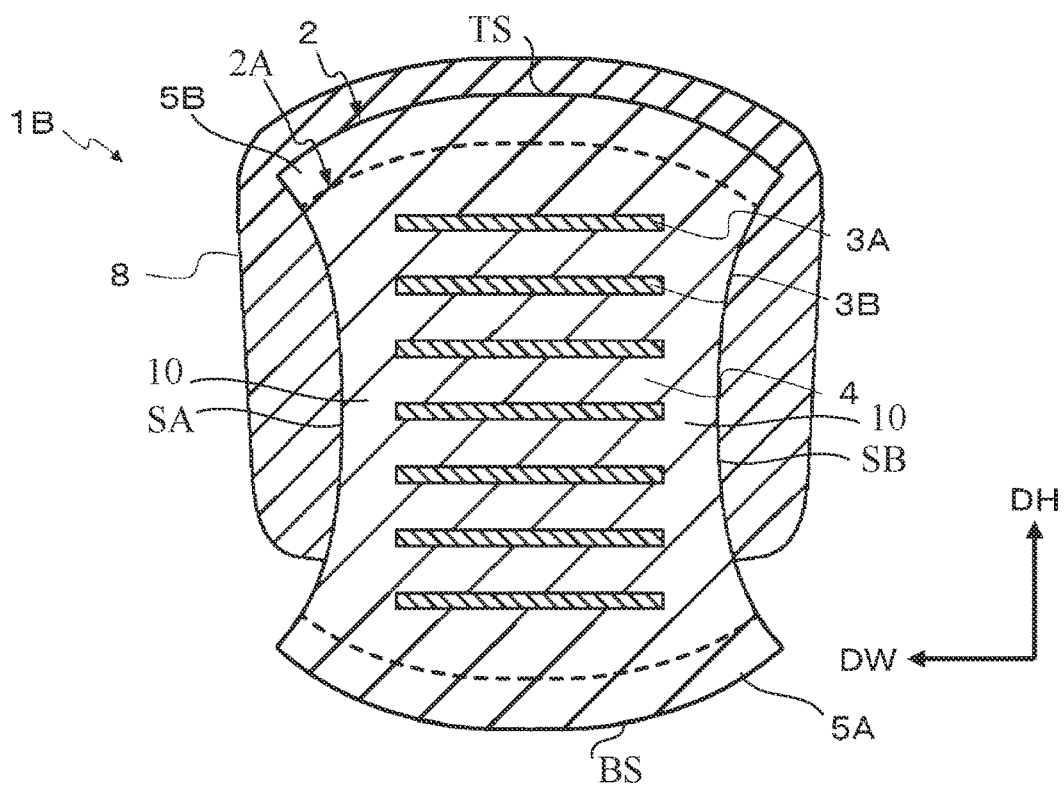
FIG. 8B is a cross-sectional view of the multilayer ceramic capacitor according to the second embodiment taken in the same manner as in FIG. 2B.
Figure 8C:
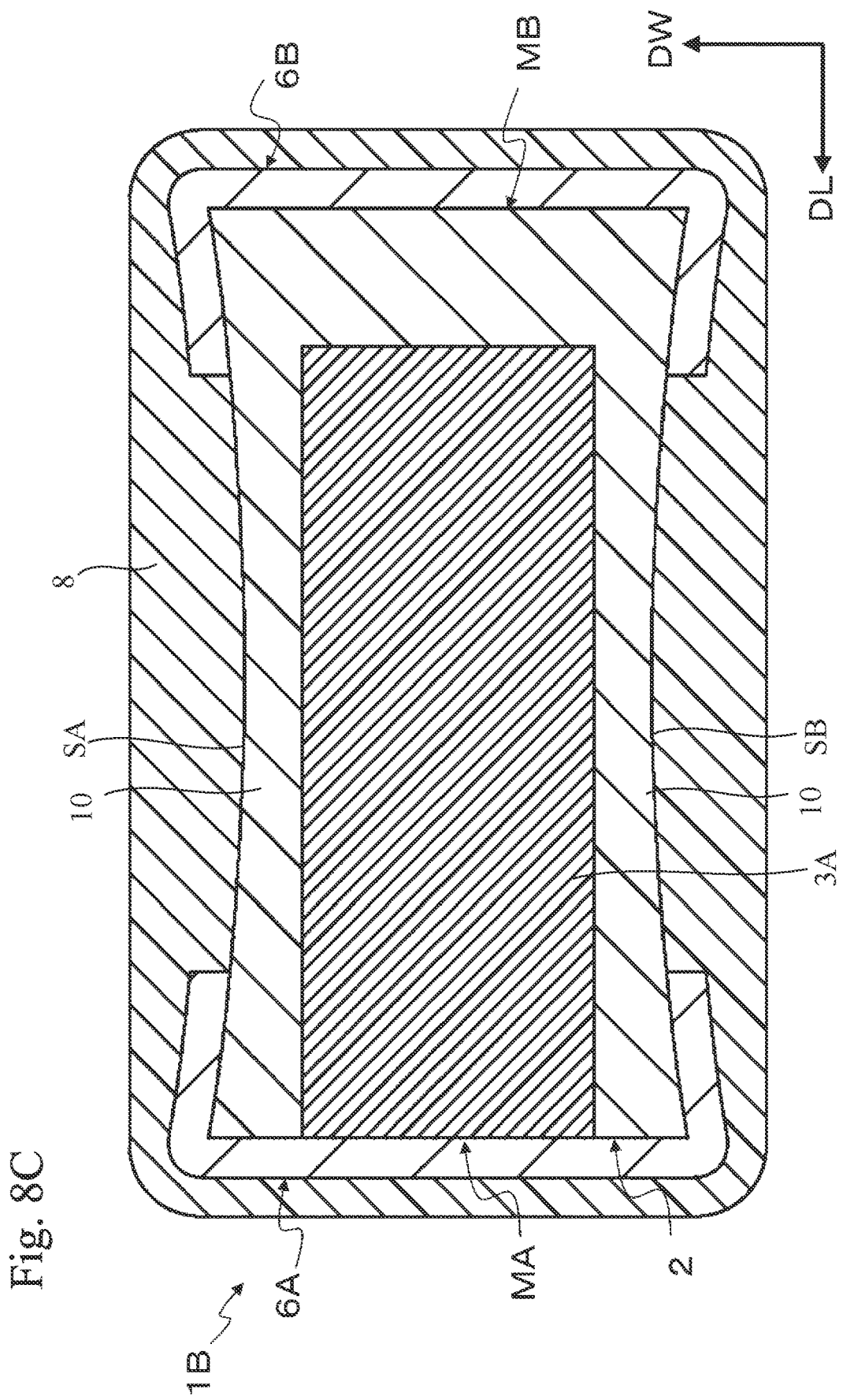
FIG. 8C is a cross-sectional view of the multilayer ceramic capacitor according to the second embodiment taken in the same manner as in FIG. 4.

FIG. 8A is a cross-sectional view of a multilayer ceramic capacitor 1B according to a second embodiment of the present invention taken in the same manner as in FIG. 2A. FIG. 8B is a cross-sectional view of the multilayer ceramic capacitor 1B according to the second embodiment taken in the same manner as in FIG. 2B. FIG. 8C is a cross-sectional view of the multilayer ceramic capacitor 1B according to the second embodiment taken in the same manner as in FIG. 4.

As shown in FIGS. 8A to 8C, the multilayer ceramic capacitor 1B has a sealing resin layer 8 in addition to the element body 2 and the external electrodes 6A and 6B. The multilayer ceramic capacitor 1B is the same as the multilayer ceramic capacitor 1A except for the sealing resin layer 8.

The sealing resin layer 8 covers the top surface TS of the element body 2, the top surface of each of the external electrodes 6A and 6B, upper portions of the side surfaces SA and SB of the element body 2, and upper portions of the side surfaces of each of the external electrodes 6A and 6B. The sealing resin layer 8 may cover the entirety of the multilayer ceramic capacitor 1B, except for the bottom surfaces of the external electrodes 6A and 6B, which are electrically connected with electrodes on a circuit substrate.

The resin layer 8 may be formed of a thermoplastic resin, a thermosetting resin, or a UV-curing resin. The material for the resin layer 8 may be applied by spraying or by dipping.

By coating the element body 2 and the external electrodes 6A and 6B with the resin layer 8, it is possible to prevent moisture from ingressing the charge storage area within the element body 2 and to improve shock resistance, thereby improving the reliability of the multilayer ceramic capacitor 1B. In addition, when the multilayer ceramic capacitor 1B is mounted on a circuit substrate with use of solder that connects the external electrodes 6A and 6B with electrodes on the circuit substrate, the sealing resin layer 8 can prevent solder from wetting up to the top surface of each of the external electrodes 6A and 6B. This makes it possible to prevent the height of the multilayer ceramic capacitor 1B from increasing after mounting on the substrate.

As shown in FIGS. 8A and 8B, the side surfaces SA and SB of the element body 2 are concavely curved along the height direction DH. Accordingly, the resin before curing can be prevented from falling down along the side surfaces SA and SB. In addition, the sealing resin layer 8 can be made thicker at the elevational center of each of the side surfaces SA and SB of the element body 2, so as to prevent moisture from ingressing the charge storage area within the element body 2. Accordingly, the reliability of the multilayer ceramic capacitor 1B can be ensured.

Third Embodiment

Figure 9:
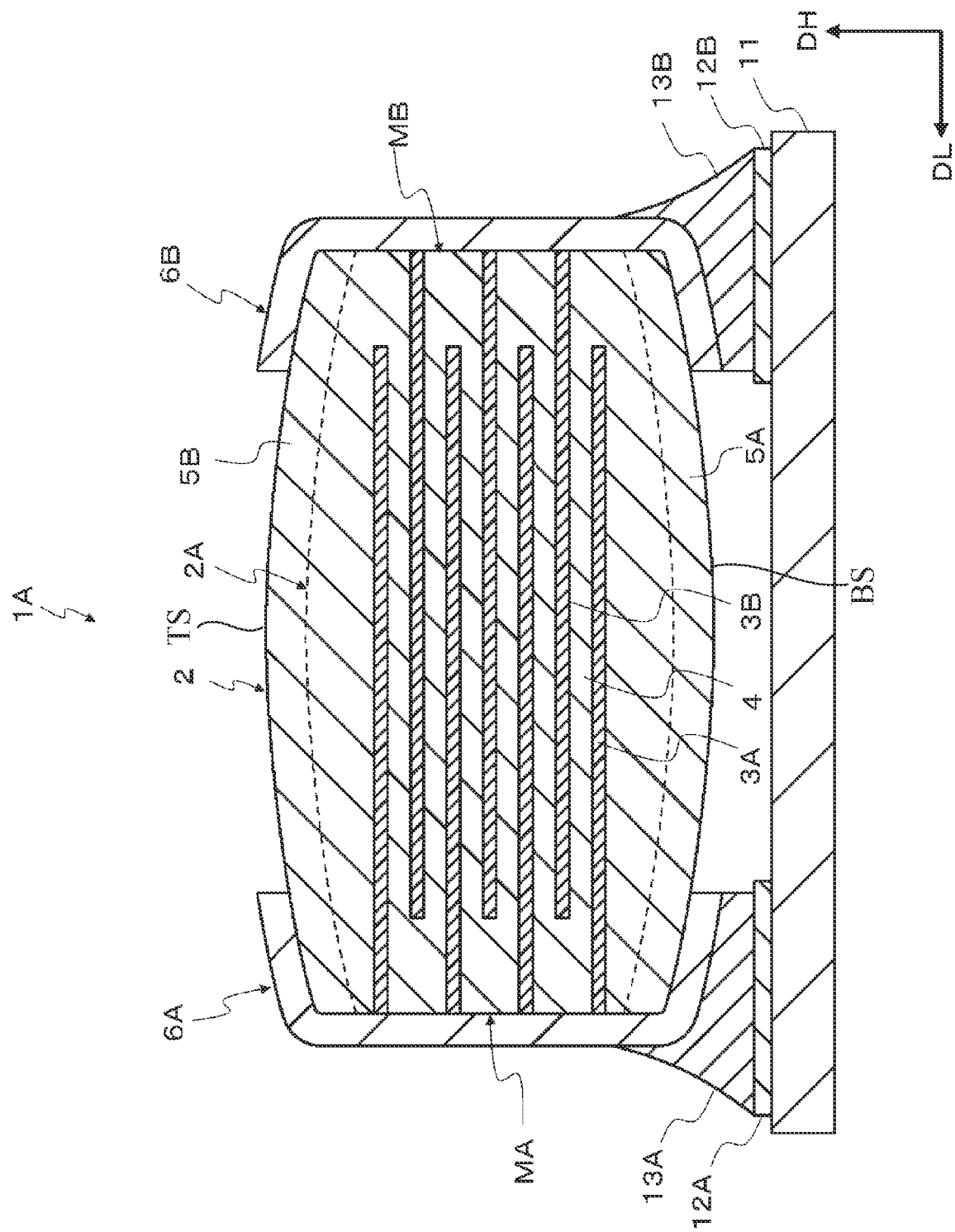
FIG. 9 is a cross-sectional view showing an arrangement according to a third embodiment of the present invention in which the multilayer ceramic capacitor is mounted on a circuit substrate.

FIG. 9 is a cross-sectional view showing an arrangement according to a third embodiment of the present invention in which the multilayer ceramic capacitor is mounted on a circuit substrate.

As shown in FIG. 9, on a circuit substrate 11, land electrodes 12A and 12B are formed on a circuit substrate 11. The circuit substrate 11 may be a printed circuit board or a semiconductor board made of, for example, Si. The multilayer ceramic capacitor 1A is connected to the land electrodes 12A and 12B via solder layers 13A and 13B attached to the plating layers 9 of the external electrodes 6A and 6B, respectively.

Each of the solder layers 13A and 13B wets up on the end surface of the corresponding external electrode 6A or 6B. If the multilayer ceramic capacitor 1A has a small height, each of the solder layers 13A and 13B may wet up to the top surface of the corresponding external electrode 6A or 6B.

However, since the top surface TS of the element body 2 is convexly curved along the longitudinal direction DL, the height of each external electrode 6A and 6B gradually decreases toward the end surfaces MA and MB of the element body 2. Accordingly, even if the solder layers 13A and 13B wet up to the top surface of the external electrodes 6A and 6B, the solder layers 13A and 13B is unlikely to reach the top surface TS of the element body 2. This results in preventing the height of the multilayer ceramic capacitor 1A from increasing when it is mounted.

Fourth Embodiment

Figure 10:
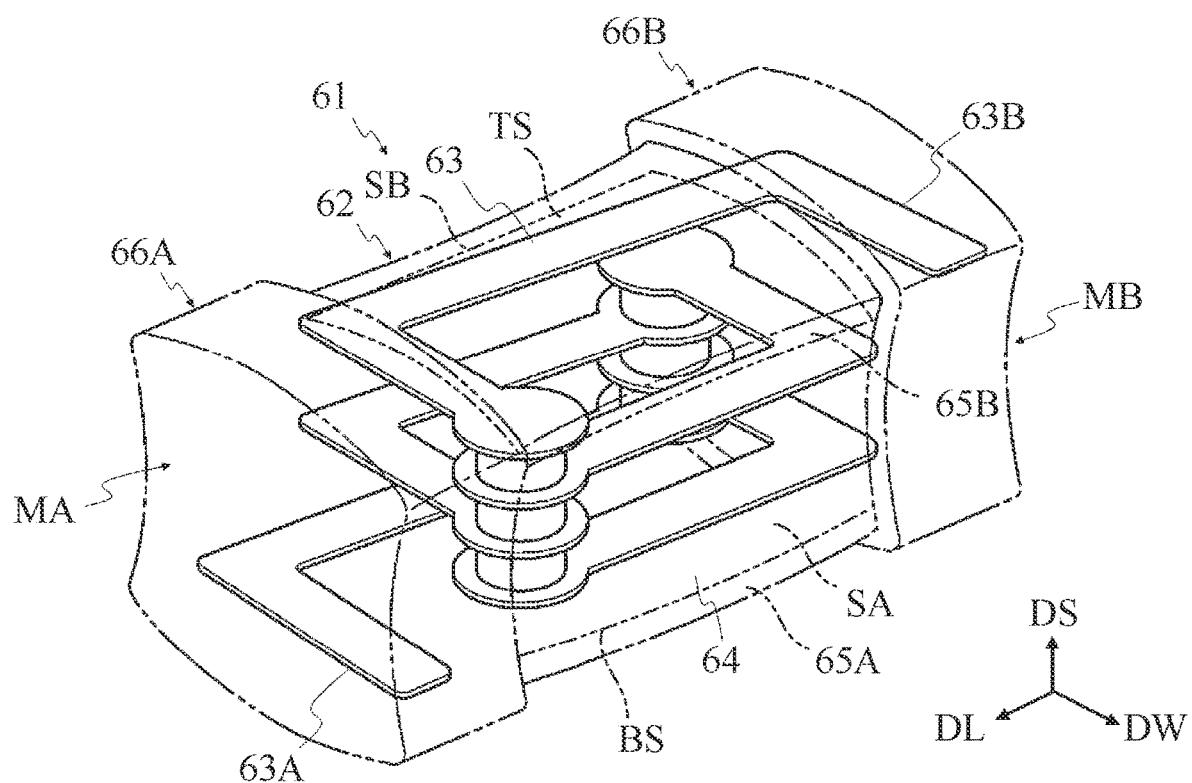
FIG. 10 is a perspective view showing a ceramic electronic component according to a fourth embodiment of the present invention.

FIG. 10 is a perspective view showing a ceramic electronic component according to a fourth embodiment of the present invention. In FIG. 10, a chip inductor is taken as an example as a ceramic electronic component.

The chip inductor 61 includes an element body 62 and two external electrodes 66A and 66B. The element body 62 includes a coil pattern 63 that includes two terminal segments 63A and 63B formed at both ends thereof and a magnetic material 64.

Portions of the coil pattern 63 including the terminal segments 63A and 63B are formed as a thin flat plate, and the entire coil pattern 63 is formed as a spiral.

The magnetic material 64 is used as a dielectric to insulate the internal electrode layers formed by the coil pattern 63.

A lower cover layer 65A similar to the lower cover layer 5A is provided on the bottom of the element body 62 and an upper cover layer 65B similar to the upper cover layer 5B is provided on the top of the element body 62.

The shrinkage temperature of the cover layers 65A and 65B is higher than that of the coil pattern 63.

The shape of the element body 62 may be a substantially rectangular parallelepiped shape.

However, the side surfaces SA and SB of the element body 62 are concavely curved along the longitudinal direction DL, so that the element body 62 has a longitudinal central part of which the width is less than the width of the longitudinal ends.

The top surface TS and the bottom surface BS of the element body 62 are convexly curved along the longitudinal direction DL, so that the element body 62 has a longitudinal central part of which the thickness is greater than the thickness of the longitudinal ends.

The side surfaces SA and SB of the element body 62 are also concavely curved along the height direction DH, so that the element body 62 has an elevational central part of which the width is less than the width of the elevational ends. The radius of curvature of each side surface along the height direction DH is the minimum at the longitudinal central part and may gradually increase toward the longitudinal ends of the element body 62 (similar to the above comparison of FIGS. 2A and 2B).

The top surface TS and the bottom surface BS of the element body 62 are convexly curved along the width direction DW, so that the element body 62 has a lateral central part of which the thickness is greater than the thickness of the lateral sides. The radius of curvature of each of the top and bottom surfaces along the width direction DW is the minimum at the longitudinal central part and may gradually increase toward the longitudinal ends of the element body 62 (similar to the above comparison of FIGS. 2A and 2B).

The coil pattern 63 is embedded in the magnetic material 64. However, the terminal segment 63A is exposed from the magnetic material 64 on one end surface MA of the element body 62 and is connected to the external electrode 66A, whereas the terminal segment 63B is exposed from the magnetic material 64 on the other end surface MB of the element body 62 and is connected to the external electrode 66B.

The material of the coil pattern 63 and the terminal segments 63A and 63B may be, for example, a metal such as Cu, Fe, Zn, Al, Sn, Ni, Ti, Ag, Au, Pt, Pd, Ta, and W, or an alloy containing at least one of these metals. The magnetic material 64 is, for example, a ferrite.

The external electrodes 66A and 66B are located on opposite sides of the element body 62, respectively, so that the external electrodes 66A and 66B are spaced (separated) from each other in the longitudinal direction DL. Each of the external electrodes 66A and 66B continuously extends from the corresponding end surface MA or MB of the element body 62 to the side surfaces and the top and bottom surfaces of the element body 62.

Experiments

The inventors conducted experiments for confirming occurrence of cracks and durability of different specimens of the multilayer ceramic capacitor 1A.

FIGS. 11 and 12 show relationship among dimensions, occurrence of cracks, and durability (results of HALT) of different specimens of the multilayer ceramic capacitor according to the first embodiment.

Specimens in FIG. 11 corresponded to "3225" according to the JIS, in which the material for the dielectric layers 4 was barium titanate, and the thickness of each dielectric layer 4 between the internal electrode layers 3A and 3B was 1.5 micrometers. The material for the internal electrode layers 3A and 3B was nickel, and the thickness of each of the internal electrode layers 3A and 3B was 1.0 micrometers. The total number of the internal electrode layers 3A and 3B was 200.

Specimens in FIG. 12 correspond to "1608" according to the JIS (length=1.6 mm, width=0.8 mm, height=0.8 mm), in which the material for the dielectric layers 4 was barium titanate, and the thickness of each dielectric layer 4 between the internal electrode layers 3A and 3B was 0.8 micrometers. The material for the internal electrode layers 3A and 3B was nickel, and the thickness of each of the internal electrode layers 3A and 3B was 0.6 micrometers. The total number of the internal electrode layers 3A and 3B was 200.

The specimens used in the experiments have various dimensions (W1, W2, W3, T1, T2, and T3). In addition, the specimens satisfy $1.20 \leq Tx/Ta \leq 1.85$.

The "results of HALT" in FIGS. 11 and 12 indicate the lifetime to which 50% of specimens are broken in HALT.

From occurrence of cracks and the results of HALT, the specimens were classified into good and bad quality.

Specimens A to I and L to T were good, whereas specimens J, K, U, and V were bad.

As the concave curvature in the width direction DW on the side surfaces SA and SB of the element body 2 increases, the aforementioned ratio $[(W2-W1)/W2]/[(T1-T2)/T2]$ increases (see FIG. 2B) since the difference between the widths W2 and W1 increases. In addition, as the concave curvature in the longitudinal direction DL on the side surfaces SA and SB of the element body 2 increases, the aforementioned ratio $(W3-W1)/W3$ increases (see FIG. 2A) since the difference between the widths W3 and W1 increases.

As the concave curvature in the width direction DW on the side surfaces SA and SB of the element body 2 increases, and as the concave curvature in the longitudinal direction DL on the side surfaces SA and SB of the element body 2 increases, occurrence of cracks can be reduced, and the lifetime of the multilayer ceramic capacitor 1A can be lengthened, so that reliability of the multilayer ceramic capacitor 1A can be ensured.

However, if the concave curvature in the width direction DW on the side surfaces SA and SB of the element body 2 is too large, the durability of the multilayer ceramic capacitor 1A will decrease. Accordingly, it is preferable that $3.5 \leq [(W2-W1)/W2]/[(T1-T2)/T2] \leq 30$, and it is more preferable that $5.5 \leq [(W2-W1)/W2]/[(T1-T2)/T2] \leq 20$.

In addition, if the concave curvature in the width direction DW on the side surfaces SA and SB of the element body 2 is too large, the durability of the multilayer ceramic capacitor 1A will decrease. Accordingly, it is preferable that $0 < (W3-W1)/W3 \leq 0.15$, and it is more preferable that $0.04 < (W3-W1)/W3 \leq 0.12$.

In the above-described embodiments, the multilayer ceramic capacitors and the chip inductor are taken as examples as ceramic electronic components, but a ceramic electronic component according to the present invention may be a chip resistor or a sensor chip. In the above-described embodiments, each of the ceramic electronic components includes two external electrodes, but the ceramic electronic component may include three or more external electrodes.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A ceramic electronic component comprising:
an element body including a dielectric, at least one first internal electrode, and at least one second internal electrode laminated over the first internal electrode via the dielectric interposed therebetween, the element body having a top surface, a bottom surface, a pair of side surfaces, a first end surface, and a second end surface, thereby the element body having a generally cuboid shape, the entirety of the side surfaces of the element body, including the top and bottom edges thereof, being concavely curved along a longitudinal direction, so that the element body has a longitudinal central part at which a width is less than a width at the end surfaces;
a first external electrode formed on the first end surface and electrically connected with the first internal electrode; and
a second external electrode formed on the second end surface and electrically connected with the second internal electrode.

2. The ceramic electronic component according to claim 1, wherein the side surfaces of the element body are concavely curved along a height direction, each of the side surfaces has a radius of curvature along the height direction that is minimum in the longitudinal central part and that increases toward the end surfaces.

3. The ceramic electronic component according to claim 1, wherein the element body satisfies $0<(W3-W1)/W3\leq 0.15$, where W1 is a width at the longitudinal central part at a center in a height direction of the element body and W3 is a width at the end surfaces at a center in the height direction of the element body.

4. The ceramic electronic component according to claim 3, wherein the element body satisfies $0.04<(W3-W1)/W3\leq 0.12$.

5. The ceramic electronic component according to claim 1, wherein the top surface and the bottom surface of the element body are convexly curved along the longitudinal direction, so that the longitudinal central part of the element body has a thickness that is greater than a thickness at the end surfaces.

6. The ceramic electronic component according to claim 1, wherein the top surface and the bottom surface of the element body are convexly curved along a width direction, so that a lateral central part of the element body has a thickness that is greater than a thickness at lateral sides.

7. The ceramic electronic component according to claim 6, wherein the element body satisfies $3.5\leq[(W2-W1)/W2]/[(T1-T2)/T2]\leq 30$, where W1 is a width at the longitudinal central part at a center in a height direction of the element body, W2 is a width at upper edges and/or lower edges at the longitudinal central part of the element body, T1 is a thickness at the longitudinal central part at a center in the width direction of the element body, and T2 is a thickness at the longitudinal central part at lateral sides of the element body.

8. The ceramic electronic component according to claim 7, wherein the element body satisfies $5.5\leq[(W2-W1)/W2]/[(T1-T2)/T2]\leq 20$.

9. The ceramic electronic component according to claim 1, further comprising a sealing resin layer covering the top surface of the element body, a top surface of each of the first and second external electrodes, upper portions of the side surfaces of the element body, and upper portions of side surfaces of each of the first and second external electrodes.

10. The ceramic electronic component according to claim 1, having a length in a range from 0.25 mm to 0.4 mm, a width in a range from 0.125 mm to 0.2 mm, and a height in a range from 0.125 mm to 0.2 mm.

11. The ceramic electronic component according to claim 1, wherein the dielectric between the first internal electrode and the second internal electrode has a thickness in a range from 0.2 micrometers to 0.5 micrometers.

12. The ceramic electronic component according to claim 1, wherein the dielectric of the element body has an average crystal grain diameter in a range from 80 nanometers to 200 nanometers.

13. The ceramic electronic component according to claim 1, wherein the first internal electrode and the second internal electrode have a thickness in a range from 0.2 micrometers to 0.8 micrometers.

14. The ceramic electronic component according to claim 1, having a capacitance in a range from 10 μF to 1000 μF.

15. The ceramic electronic component according to claim 1, wherein a main component of a material for the first and second external electrodes is Ni.

16. A circuit substrate arrangement comprising:
a circuit substrate; and
the ceramic electronic component according to claim 1 mounted on the circuit substrate, the ceramic electronic component being connected to the circuit substrate via solder layers adhered to the first and second external electrodes, each of the solder layers wetting up on an end surface of the first external electrode or the second external electrode.

* * * * *